United States Patent
Onishi

(10) Patent No.: US 9,257,943 B2
(45) Date of Patent: Feb. 9, 2016

(54) AMPLIFIER CIRCUIT AND WIRELESS COMMUNICATION EQUIPMENT

(75) Inventor: Masahiko Onishi, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 64 days.

(21) Appl. No.: 13/993,960

(22) PCT Filed: Nov. 30, 2011

(86) PCT No.: PCT/JP2011/077659
§ 371 (c)(1),
(2), (4) Date: Jun. 13, 2013

(87) PCT Pub. No.: WO2012/086379
PCT Pub. Date: Jun. 28, 2012

(65) Prior Publication Data
US 2013/0285743 A1    Oct. 31, 2013

(30) Foreign Application Priority Data
Dec. 22, 2010  (JP) ................... 2010-286494

(51) Int. Cl.
*H03F 1/26* (2006.01)
*H03F 1/32* (2006.01)
(Continued)

(52) U.S. Cl.
CPC ............ *H03F 1/3258* (2013.01); *H03F 1/0222* (2013.01); *H03F 1/3241* (2013.01);
(Continued)

(58) Field of Classification Search
CPC ........................................ H03F 1/32
USPC ................. 330/149; 375/296, 297; 455/114.3
See application file for complete search history.

(56) References Cited

U.S. PATENT DOCUMENTS 6,801,086 B1    10/2004  Chandrasekaran
7,706,467 B2 *  4/2010   Kenington ............. 375/296
(Continued)

FOREIGN PATENT DOCUMENTS

JP    2009-188636 A    8/2009
JP    2009-194432 A    8/2009
(Continued)

OTHER PUBLICATIONS

Arrangement for the digital pre-distortion of an envelope-tracking power amplifier, ip.com Journal, ip.com Inc., Aug. 20, 2007, XP013121509, ISSN: 1533-0001.
(Continued)

*Primary Examiner* — Khanh V Nguyen
*Assistant Examiner* — Khiem Nguyen
(74) *Attorney, Agent, or Firm* — Drinker Biddle & Reath LLP

(57) ABSTRACT

Distortion compensation is performed taking into account a memory effect that occurs in a signal path other than an input-to-output path of an amplifier. An amplifier circuit 1 includes an amplifier 2 that amplifies a signal, a variable power supply 3 that varies a power supply voltage of the amplifier 2 in accordance with envelope change, and a distortion compensation section 4 that performs compensation for distortion characteristics. The distortion compensation section 4 performs the distortion compensation, based on an amplifier model which represents a memory effect that occurs on a path from a signal input port 2a of the amplifier 2 to a signal output port 2b thereof, and a memory effect that occurs on a path from a power supply port 2c of the amplifier 2 to the signal output port 2b thereof.

19 Claims, 11 Drawing Sheets

(51) Int. Cl.
*H03F 1/02* (2006.01)
*H03F 3/189* (2006.01)
*H03F 3/24* (2006.01)

(52) U.S. Cl.
CPC .............. *H03F1/3247* (2013.01); *H03F 3/189* (2013.01); *H03F 3/24* (2013.01); *H03F 3/245* (2013.01); *H03F 2200/102* (2013.01); *H03F 2200/105* (2013.01); *H03F 2200/336* (2013.01); *H03F 2200/408* (2013.01); *H03F 2200/504* (2013.01); *H03F 2201/3209* (2013.01); *H03F 2201/3224* (2013.01)

(56) References Cited

U.S. PATENT DOCUMENTS

| | | | |
|---|---|---|---|
| 8,198,950 | B2 | 6/2012 | Yamanouchi et al. |
| 8,364,101 | B2 * | 1/2013 | Shizawa et al. ............ 455/114.3 |
| 2007/0298734 | A1 | 12/2007 | Woo et al. |
| 2009/0174473 | A1 | 7/2009 | Woo et al. |
| 2010/0277236 | A1 | 11/2010 | Horiguchi et al. |
| 2010/0295613 | A1 | 11/2010 | Asbeck et al. |

FOREIGN PATENT DOCUMENTS

| | | |
|---|---|---|
| JP | 2009-200694 A | 9/2009 |
| JP | 2009-290283 A | 12/2009 |
| JP | 2010-050908 A | 3/2010 |
| JP | 2010-130666 A | 6/2010 |
| JP | 2010-166450 A | 7/2010 |
| WO | WO-2009/090825 A1 | 7/2009 |
| WO | WO 2010/044346 A1 | 4/2010 |

OTHER PUBLICATIONS

J. Kim et al., "Digital predistortion of wideband signals based on power amplifier model with memory," Electronics Letters, vol. 37, No. 23, Nov. 2001, pp. 1417-1418.

Donald F. Kimball et al., "High-Efficiency Envelope-Tracking W-CDMA Base-Station Amplifer Using GaN HFETs," IEEE Transactions on Microwave Theory and Techniques, vol. 54, No. 11, Nov. 2006, pp. 3848-3856.

Feipeng Wang et al., "Design of Wide-Bandwidth Envelope-Tracking Power Amplifiers for OFDM Applications," IEEE Transactions on Microwave Theory and Techniques, vol. 53, No. 4, Apr. 2005, pp. 1244-1255.

Oualid Hammi et al., "A Compact Envelope-Memory Polynomial for RF Transmitters Modeling With Application to Baseband and RF-Digital Predistortion," IEEE Microwave and Wireless Components Letters, vol. 18, No. 5, May 2008, pp. 359-361.

Anding Zhu et al., "Digital Predistortion for Envelope-Tracking Power Amplifiers Using Decomposed Piecewise Volterra Series," IEEE Transactions on Microwave Theory and Techniques, vol. 56, No. 10, Oct. 2008, pp. 2237-2247.

Donald Kimball et al., "High Efficiency WCDMA Envelope Tracking Base-Station Amplifier Implemented with GaAs HVHBTs," IEEE 11, Dec. 2008, pp. 1-4.

* cited by examiner

AMPLIFIER CIRCUIT AND WIRELESS COMMUNICATION EQUIPMENT

TECHNICAL FIELD

The present invention relates to an amplifier circuit and wireless communication equipment.

BACKGROUND ART

When amplifying power by using an amplifier such as a high power amplifier (hereinafter referred to as "HPA") or the like, desired input-output characteristics may not be obtained due to nonlinear distortion characteristics of the amplifier.

Particularly when the frequency of a radio signal to be amplified is high, in order to linearize the amplifier by compensating the nonlinear characteristics, a complex IQ baseband signal of a low frequency, before being converted to the radio signal, needs to be subjected to predistortion for canceling the nonlinear distortion characteristics of the amplifier in advance by using digital signal processing, as described in Patent Literature 1.

In the predistortion process, a model or an inverse mode (distortion compensation model) of the amplifier is estimated, and a distortion in the amplifier is compensated based on the estimated model.

With increase in communication speed in recent years, it has been needed to amplify a wideband signal. When amplifying a wideband signal, since an output signal from the amplifier is distorted also by influence of a memory effect of the amplifier, such a distortion should be compensated. Non-Patent Literature 1 proposes a distortion compensation model of an amplifier taking into account such a memory effect.

As shown in FIG. 10, in an amplifier circuit having a distortion compensation section 101 for an amplifier 100, a conventional model taking into account a memory effect is expressed by equation (1).

[Equation 1]

$$y[n] = \sum_{l=-L_1}^{L_2} \sum_{k=1}^{K_l} h_{k,l} \cdot |u[n-l]|^{k-1} \cdot u[n-l] \quad (1)$$

where
y[n] is an output signal of the amplifier 100,
k is an order,
l is a relative delay with respect to an input signal u[n] of the amplifier 100,
$L_1$ is a maximum value of relative number of preceding samples,
$L_2$ is a maximum value of relative number of delay samples,
$K_l$ is a maximum order of the characteristic of the amplifier, wherein the index is a coefficient relating to the relative delay l, and
$h_{k,l}$ is a complex coefficient representing the characteristic of the amplifier 100, wherein the indices are a coefficient relating to the relative delay l, and a coefficient relating to the order k.

As shown in FIG. 11, in the conventional model expressed by equation (1), the memory effect that occurs inside the amplifier 100 is represented as a combination of a plurality of nonlinear elements NL (from memory term 0 to memory term $L_1+L_2$) having temporally different characteristics.

The characteristic of each of the plurality of nonlinear elements NL is expressed by equation (2).

As shown in equation (2), the nonlinear characteristic (input-output characteristic) of each nonlinear element NL is defined based on an input signal u[n'] to the amplifier 100.

[Equation 2]

$$Y_{l'}[n'] = \sum_{k=1}^{K_{l'-L_1}} h_{k,l'-L_1} \cdot |u[n'-l']|^{k-1} \cdot u[n'-l'] \quad (2)$$

where
$Y_{l'}[n']$ is an output of the nonlinear element NL,
k is an order,
l' is a relative delay with respect to the input signal u[n'],
$L_1$ is a maximum value of relative number of preceding samples,
$L_2$ is a maximum value of relative number of delay samples,
$K_{l'-L_1}$ is a maximum order of the characteristic of the nonlinear element, wherein the index is a coefficient relating to the relative delay l'−$L_1$, and
$h_{k,l'-L_1}$ is a complex coefficient representing the characteristic of the nonlinear element NL, wherein the indices are a coefficient relating to the relative delay l'−$L_1$, and a coefficient relating to the order k.

Further, as shown in FIG. 11, each nonlinear element NL is given the input signal u[n']. However, a delay element D is provided in a stage preceding each of the nonlinear elements NL corresponding to the memory terms 1 to $L_1+L_2$, so that the input signals u[n'] given to the respective nonlinear elements NL are temporally different from each other.

That is, the nonlinear elements NL corresponding to the memory terms 1 to $L_1+L_2$ represent the memory effect of the amplifier.

Accordingly, based on equation (2) and FIG. 11, the following equations (3a) and (3b) are derived as equations expressing models taking into account the memory effect.

[Equation 3]

$$y[n'-L_1] = \sum_{l'=0}^{L_1+L_2} \sum_{k=1}^{K_{l'-L_1}} h_{k,l'-L_1} \cdot |u[n'-l']|^{k-1} \cdot u[n'-l'] \quad (3a)$$

$$y[n] = \sum_{l=-L_1}^{L_2} \sum_{k=1}^{K_l} h_{k,l} \cdot |u[n-l]|^{k-1} \cdot u[n-l] \quad (3b)$$

Note that equation (3a) expresses a model directly derived from equation (2) and FIG. 11, and equation (3b) expresses a model derived by replacing n'−$L_1$ and l'−$L_1$ in equation (3a) with n and l, respectively.

Meanwhile, in order to enhance the power efficiency of the amplifier at the same time, a method has been proposed in which the power supply voltage (drain signal) of the amplifier is modulated by using the input signal of the amplifier, and the power consumption of the amplifier is dynamically varied in accordance with the magnitude of the input signal (this method is called "power supply modulation" or "envelope tracking") (for example, refer to Patent Literature 2, and Non-Patent Literatures 2 and 3). In the power supply modulation method, when the voltage of the input signal is small, the power consumption of the amplifier is suppressed, whereby the power efficiency is enhanced. In this way, a high-efficiency amplification technique is provided.

CITATION LIST

Patent Literature

[PTL 1] Japanese Laid-Open Patent Publication No. 2009-194432
[PTL 2] Japanese Laid-Open Patent Publication No. 2009-290283

Non Patent Literature

[NPL 1] Kim, J. and Konstantinou, K., "Digital predistortion of wideband signals based on power amplifier model with memory, 2" Electron. Lett., Vol. 37, pp. 1417-1418, November 2001
[NPL 2] Donald F. Kimball, et al., "High-Efficiency Envelope-Tracking W-CDMA Base-Station Amplifier Using GaN HFETs", IEEE Transactions on Microwave Theory and Techniques, Vol. 54, No. 11, November 2006
[NPL 3] Feipeng Wang, et. al., "Design of Wide-Band Envelope-Tracking Power Amplifiers for OFDM Applications", IEEE Transactions on Microwave Theory and Techniques, Vol. 53, No. 4, April 2005

SUMMARY OF THE INVENTION

Problems to be Solved by the Invention

The inventors of the present invention have found the following problems. When the conventional amplifier model that operates at a fixed voltage is applied to an amplifier that performs an envelope tracking operation (hereinafter referred to as an ET operation), sufficient compensation can be realized if the signal band to be amplified is narrow. However, if the signal band is widened to increase the communication speed, a minute distortion, which has conventionally been negligible, increases to a non-negligible level. Such a distortion impedes the communication, or causes unnecessary radiation that interferes with another communication.

The present invention is made in connection with solution of the above-described problems.

Solution to the Problems (1) In order to solve the above-described problems caused by the signal band widening, the inventors of the present invention have diligently studied and come up with an idea that a memory effect, which has conventionally not been recognized in an amplifier, should be taken into account. That is, in the conventional model, as is apparent from equation (1), only a memory effect which occurs between an input and an output of an amplifier has been taken into account as a memory effect.

However, if an envelope tracking method is adopted in order to enhance the efficiency of the amplifier, a power supply voltage (drain voltage) of the amplifier 100 varies in accordance with an envelope signal of an input signal. That is, in the envelope tracking method, a transmission signal (or a waveform-shaped transmission signal) is input to the amplifier while controlling the power supply voltage supplied to the amplifier in accordance with the input signal power. Such an amplifier adopting the envelope tracking method, whose power supply voltage varies as described above, has two inputs.

In such a two-input amplifier, signals inputted through a plurality of different paths, such as an input-to-output path of the amplifier and a power-supply-to-output path of the amplifier, are combined in the amplifier. Accordingly, the signals inputted to the amplifier are influenced by the frequency characteristics and/or the memory effects in the respective paths, which might cause a large distortion in the amplifier output.

The inventors of the present invention have discovered the following. That is, when the signal band is relatively narrow, the frequency characteristics and/or the memory effect in the power-supply-to-output path of the amplifier do not significantly influence the amplifier output. However, when the signal band is widened, the characteristics in the power-supply-to-output path of the amplifier become non-negligible.

The present invention according to the above aspect is an amplifier circuit including: an amplifier that amplifies a signal; a variable power supply that varies a power supply voltage or a power supply current to be supplied to a power supply port of the amplifier, in accordance with change in an envelope of the signal; and a distortion compensation section that performs compensation for distortion characteristics of the amplifier. The distortion compensation section performs a process of compensating a memory effect that occurs on a path from the power supply port to a signal output port.

According to the above invention, the memory effect that occurs on the path from the power supply port of the amplifier to the signal output port can be compensated. A signal used to obtain the envelope is not necessarily a signal itself to be amplified by the amplifier (for example, u[n] in the embodiment), and the signal may be a pre-distortion-compensation signal (for example, x[n] in the embodiment).

(2) Preferably, the distortion compensation section performs a process of compensating a memory effect that occurs on a path from a signal input port of the amplifier to the signal output port, and a memory effect that occurs on the path from the power supply port to the signal output port.

In this case, it is possible to compensate both the memory effect that occurs on the path from the signal input port of the amplifier to the signal output port, and the memory effect that occurs on the path from the power supply port to the signal output port.

(3) Preferably, the distortion compensation section includes an estimation section that estimates a model of the amplifier, and performs distortion compensation based on the model (either an inverse model or a forward model may be used, and hereinafter, the same applies) estimated by the estimation section. Preferably, the model is a model in which at least the memory effect that occurs on the path from the power supply port to the signal output port is represented. More preferably, in the model, the memory effect that occurs on the path from the signal input port to the signal output port is also represented.

(4) Preferably, the distortion compensation section includes an estimation section that estimates a model of the amplifier, and performs distortion compensation based on the model estimated by the estimation section. In the model, the amplifier is modeled as a combination of a plurality of element amplifiers, the plurality of element amplifiers in the model are each given an input signal inputted to the signal input port, and the power supply voltage or the power supply current supplied from the variable power supply. A combination of outputs from the plurality of element amplifiers in the model corresponds to an output of the amplifier. The plurality of element amplifiers in the model each have nonlinear characteristic which is defined based on the input signal inputted to the signal input port, and the power supply voltage or the power supply current supplied from the variable power supply. The plurality of element amplifiers in the model are given the power supply voltage or the power supply current at different times, respectively.

(5) Preferably, the plurality of element amplifiers in the model are each modeled as a combination of a plurality of nonlinear elements. The plurality of nonlinear elements are each given the input signal inputted to the signal input port. A combination of outputs of the plurality of nonlinear elements corresponds to an output of the element amplifier. The plurality of nonlinear elements each have nonlinear characteristic which is defined based on the input signal and the power supply voltage or the power supply current. The plurality of nonlinear elements are given the input signal at different times, respectively.

(6) The amplifier model estimated by the distortion compensation section may be based on equation (10) described later as an embodiment. The "amplifier model based on equation (10)" includes, in addition to a model directly corresponding to equation (10), an inverse model thereof (equation (12)), and further, models based on equations (equation (15) and the like) obtained by transforming equation (10).

(7) Preferably, the distortion compensation section performs a process of compensating a memory effect that occurs on a path from the power supply port to the signal output port, and a memory effect that occurs on a path from a signal output port of the distortion compensation section to the signal output port of the amplifier.

(8) The amplifier model estimated by the distortion compensation section may be based on equation (15) described later as an embodiment. The "amplifier model based on equation (15)" includes, in addition to a model directly corresponding to equation (15), an inverse model thereof (equation (17)), and further, models based on equations (equation (18) and the like) obtained by transforming equation (15).

(9) The amplifier model estimated by the distortion compensation section may be based on equation (18) described later as an embodiment.

(10) The present invention according to another aspect is an amplifier circuit including: an amplifier that amplifies a signal; and a distortion compensation section that performs compensation for distortion characteristics of the amplifier. The distortion compensation section performs a process of compensating a memory effect that occurs on a path from an input port other than a signal input port of the amplifier, to a signal output port.

According to the above invention, it is possible to compensate a memory effect that occurs on a path from an input port other than the signal input port of the amplifier, to the signal output port.

(11) The present invention according to still another aspect is an amplifier circuit including: an amplifier that amplifies a signal; a variable power supply that varies a power supply voltage or a power supply current to be supplied to a power supply port of the amplifier, in accordance with change in an envelope of the signal; and a distortion compensation section that includes an estimation section that estimates a model of the amplifier, and performs distortion compensation based on the model estimated by the estimation section. In the model, the amplifier has nonlinear characteristic which is defined based on an input signal inputted to a signal input port of the amplifier, and the power supply voltage or the power supply current supplied from the variable power supply.

As described above, in the method in which the power supply voltage or the power supply current varies in accordance with the envelope signal, such as the envelope tracking method, the amplifier has two inputs. The signals inputted to the amplifier are influenced by the frequency characteristics and/or the memory effects in the respective paths, which causes a large distortion in the amplifier output.

Therefore, as in the present invention, by adopting the amplifier model in which the nonlinear characteristic is defined based on the input signal inputted to the signal input port and the power supply voltage or the power supply current supplied from the variable power supply, the characteristics of the respective paths can be appropriately represented, thereby obtaining a model more favorable than the conventional model.

(12) The above model may be an amplifier model based on equation (4) described later as an embodiment.

(13) In the model, the amplifier is modeled as a combination of a plurality of nonlinear elements, the plurality of nonlinear elements are each given the input signal inputted to the signal input port. A combination of outputs from the plurality of nonlinear elements corresponds to the output of the amplifier. The plurality of nonlinear elements each have nonlinear characteristic which is defined based on the input signal and the power supply voltage or the power supply current. The plurality of nonlinear elements are given the input signal at different times, respectively. In this case, a model is obtained in which at least a memory effect on a path from the signal input port to the output signal port is represented. Of course, it is allowed to take into account a memory effect in a path from the power supply port to the output signal port.

(14) The above model may be an amplifier model based on equation (7) described later as an embodiment.

(15) The present invention according to still another aspect is wireless communication equipment including the amplifier circuit according to any one of the above sections (1) to (14), for amplification of a transmission signal or amplification of a reception signal.

Effect of the Invention

According to the inventions described in the sections (1) to (9) and the invention described in the section (15) based on any of the sections (1) to (9), it is possible to compensate the memory effect on the path from the power supply port to the signal output port.

According to the invention described in the section (10) and the invention described in the section (15) based on the section (10), it is possible to compensate the memory effect that occurs on the path from an input port other than the signal input port of the amplifier to the signal output port.

According to the inventions described in the sections (11) to (14) and the invention described in the section (15) based on any of the sections (11) to (14), it is possible to provide an appropriate amplifier model because a plurality of paths are taken into account, as compared with an amplifier model taking into account a single path.

DESCRIPTION OF EMBODIMENTS

Figure 1:
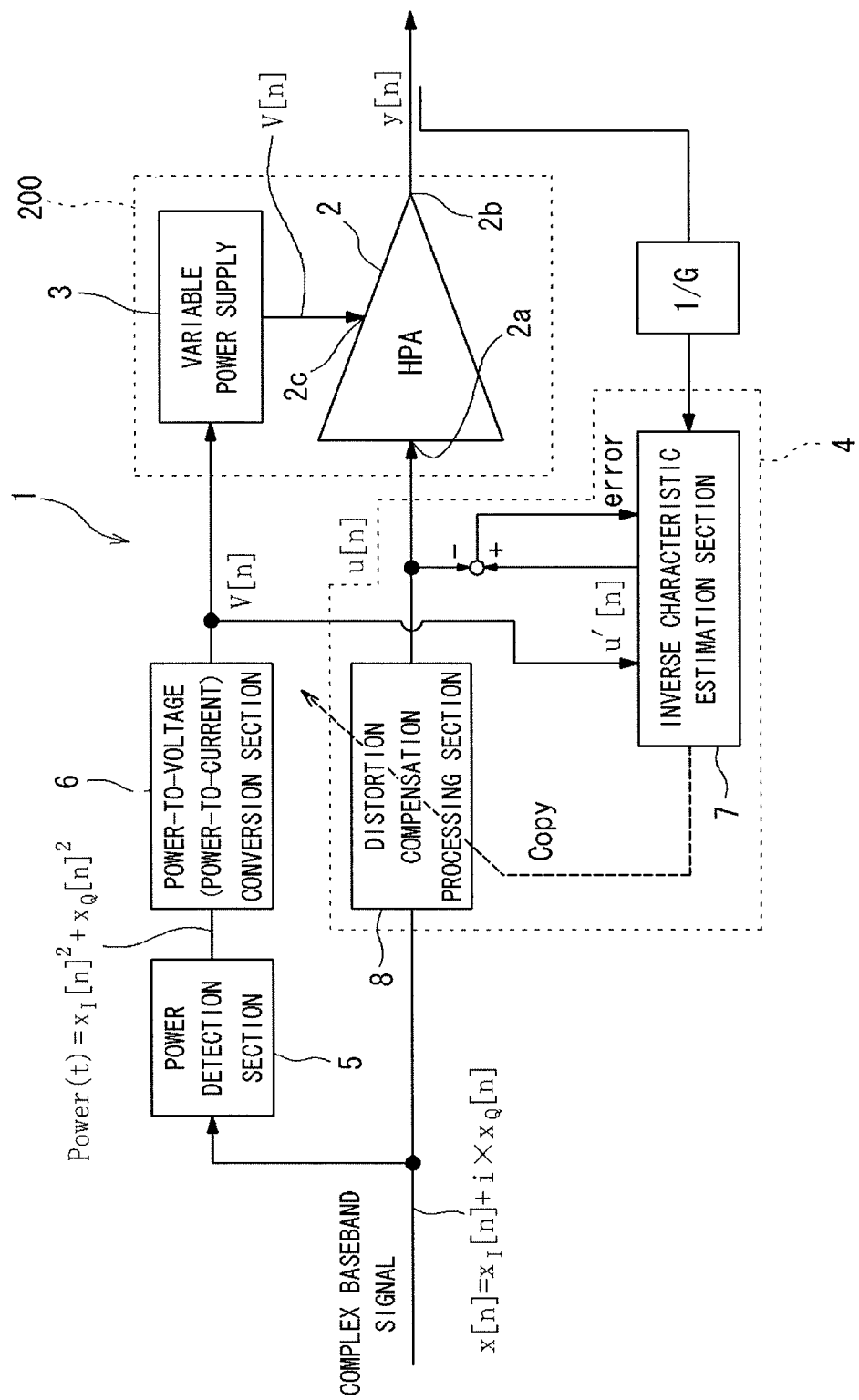
FIG. 1 is a block diagram showing an amplifier circuit.

Hereinafter, a preferred embodiment of the present invention will be described with reference to the drawings.
[1. Amplifier Circuit]
FIG. 1 shows an amplifier circuit 1 according to an embodiment. The amplifier circuit 1 is included in wireless communication equipment such as wireless base station equipment, and is used for amplification of a transmission signal. The amplifier circuit 1 may be used for amplification of a reception signal.

The amplifier circuit 1 includes a high-power amplifier (HPA) 2, a variable power supply 3, and a distortion compensation section 4. The amplifier 2 is used for amplifying an input signal, and includes a signal input port 2a to which a signal is input, and a signal output port 2b from which the signal is output.

The amplifier 2 further includes a power supply port 2c to which a power supply voltage (drain voltage) V[n] is supplied. In the amplifier 2, the power supply port 2c is an input port other than the signal input port 2a.

The amplifier circuit 1 adopts the envelope tracking method. Therefore, the variable power supply 3 varies the power supply voltage V[n] supplied to the power supply port 2c of the amplifier 2, in accordance with an envelope signal of a signal x[n]. That is, the amplifier 2 and the variable power supply 3 constitute an amplifier (hereinafter referred to as an ET amplifier) 200 that performs an envelope tracking operation. Since the power supply voltage supplied to the amplifier 2 varies in accordance with the envelope of the signal x[n], high-efficiency operation of the amplifier 2 is realized.

The variable power supply 3 is not limited to one which varies the power supply voltage (drain voltage) V[n], but may be one which varies a power supply current (drain current). Hereinafter, the variable power supply 3 will be described as one which varies the power supply voltage. However, even when "power supply voltage" is replaced with "power supply current" in the following description, functional equivalence is maintained.

In order to give the envelope signal of the signal x[n] to the variable power supply 3, the amplifier circuit 1 includes a power detection section 5 for the signal x[n], and a power-to-voltage conversion section 6.

The power detection section 5 detects and outputs a power value of the signal x[n] (complex IQ baseband signal), i.e., the envelope signal of the signal x[n]. The power-to-voltage conversion section 6 has a function of converting the power detected by the power detection section 5 to a power supply voltage value to be supplied to the amplifier 2. The power-to-voltage conversion section 6 outputs the converted power supply voltage value (envelope voltage value) to the variable power supply 3. The variable power supply 3 dynamically varies the voltage V[n] to be supplied to the power supply port 2c of the amplifier 2, in accordance with the converted power supply voltage value (envelope voltage value).

The distortion compensation section 4 includes an estimation section 7 that estimates a model of the ET amplifier 200, and a distortion compensation processing section 8 that performs a process of predistortion for the signal x[n].

The estimation section 7 of the present embodiment is configured as an inverse characteristic estimation section 7 that estimates an inverse model representing inverse characteristic of the ET amplifier 200, as a model of the ET amplifier 200. The details of the model estimated by the estimation section 7 and the estimation method will be described later.

The distortion compensation processing section 8 obtains the inverse model of the ET amplifier 200, which has been estimated by the estimation section 7, performs a distortion compensation process for the signal x[n], based on the inverse model, and outputs the distortion compensated signal u[n]. Since the signal u[n], which has been compensated with the characteristic inverse to the distortion characteristic of the ET amplifier 200, is used as an input signal to the ET amplifier 200 having the distortion characteristic, a distortion-suppressed amplifier output y[n] can be obtained.

In FIG. 1, only the main components among the components of the amplifier circuit 1 are shown. Specifically, the amplifier circuit 1 has a circuit configuration shown in FIG. 2. In the amplifier 1 shown in FIG. 2, timing adjustment sections 31a, 31b are provided in stages preceding the distortion compensation section 4 and/or the power-to-voltage conversion section 6. The timing adjustment sections 31a, 31b each perform timing adjustment so that the times from when the signal (x[n]) is input to the amplifier circuit to when the input signal, passing through the different paths, reaches the output of the amplifier are made equal to each other.

Figure 2:
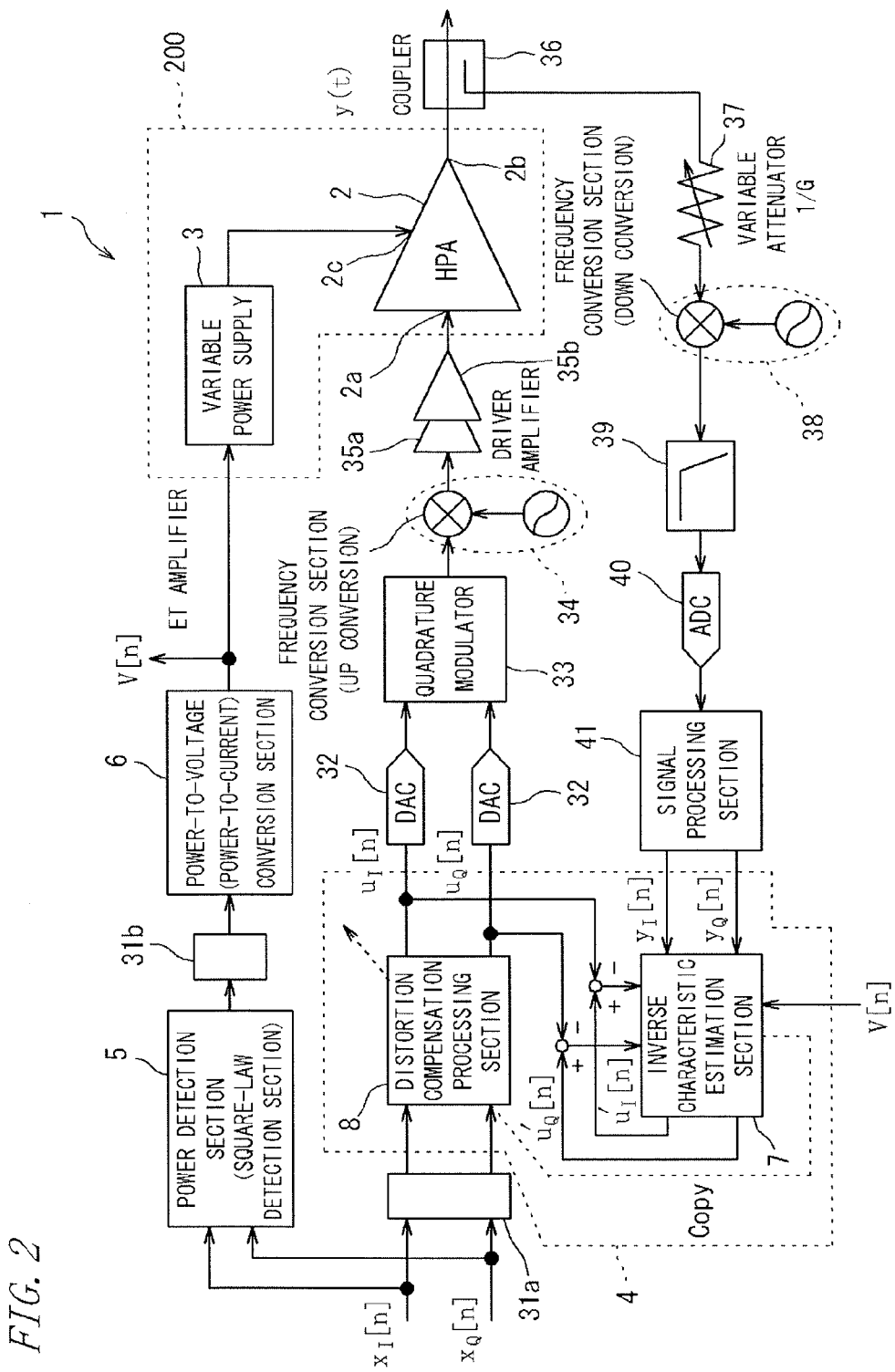
FIG. 2 is a specific circuit diagram showing the amplifier circuit shown in FIG. 1.

In FIG. 2, DACs 32, 32 for converting a digital signal to an analog signal are provided on the output side of the distortion compensation section 4, and analog IQ baseband signals obtained by the DACs 32 are quadrature-modulated by a quadrature modulator 33. The quadrature-modulated signal is up-converted by a frequency conversion section 34. The up-converted signal is provided to one or a plurality of driver amplifiers 35a, 35b, and amplified. The output from the driver amplifiers 35a, 35b is provided to the amplifier 2 constituting the ET amplifier 200. In the present embodiment, the driver amplifiers 35a, 35b are supplied with a power supply voltage not from a variable power supply but from a fixed-voltage power supply. However, like the amplifier 2, the driver amplifiers 35a, 35b may be supplied with a power supply voltage from the variable power supply 3.

In FIG. 2, an output signal y(t) of the amplifier 2 is detected by a coupler 36, and provided to a frequency conversion section 38 via a variable attenuator (1/G) 37. The frequency conversion section 38 down-converts the signal. The frequency-converted signal is provided to an ADC 40 via a filter (low-pass filter or band-pass filter) 39. The ADC converts the analog signal to a digital signal, and provides its output to a signal processing section 41. The signal processing section 41 performs signal processing such as digital quadrature demodulation, and provides a resultant digital IQ baseband signal to the distortion compensation section 4.

Although the amplifier circuit 1 is actually configured as shown in FIG. 2, since the amplifier circuit 1 can be described simply by using, as a premise, only the configuration shown in FIG. 1, the following description will be made mainly based on FIG. 1.

The names of signals shown in FIGS. 1 and 2 will be described hereinafter.

First, *[n] is a digital complex baseband IQ signal that is sampled at time n×T when the sampling interval is T (sec). In addition, *(t) indicates an analog signal at time t. However, since the present embodiment deals with distortion compensation in the digital signal region in the distortion compensation section 4, signals are mostly represented by *[n].

Specifically, x[n] is an input signal before subjected to distortion compensation by the distortion compensation section 4, $x_I[n]$ is a real part (I-channel) of x[n], and $x_Q[n]$ is an imaginary part (Q-channel) of x[n]. That is, $x[n]=x_I[n]+i\times x_Q[n]$ is satisfied.

u[n] is the input signal that has been subjected to distortion compensation by the distortion compensation section 4, $u_I[n]$ is a real part (I-channel) of u[n], and $u_Q[n]$ is an imaginary part (Q-channel) of u[n]. That is, $u[n]=u_I[n]+i\times u_Q[n]$ is satisfied.

u'[n] is a replica signal for inverse characteristic estimation, $u_I'[n]$ is a real part (I-channel) of u'[n], and $u_Q'[n]$ is an imaginary part (Q-channel) of u'[n]. That is, $u'[n]=u_I'[n]+i\times u_Q'[n]$ is satisfied.

y[n] is an output signal of the amplifier 2, $y_I[n]$ is a real part (I-channel) of y[n], and $y_Q[n]$ is an imaginary part (Q-channel) of y[n]. That is, $y[n]=G\times(y_I[n]+i\times y_Q[n])$ is satisfied.

[2. ET Amplifier Model]

In the conventional amplifier model, as shown in equation (2), the nonlinear characteristic of the amplifier is defined in accordance with the input signal u[n] to the amplifier.

In contrast to the conventional amplifier model, the nonlinear characteristic of ET amplifier 200 whose power supply voltage V[n] varies depending on the envelope signal is defined by equation (4) using the power supply voltage (drain voltage) V[n].

[Equation 4]

$$Y''_{l'',m''}[n''-M_1] = \sum_{k=1}^{K_{l''-L_1,m''-M_1}} H_{k,l''-L_1,m''-M_1} \cdot |V[n''-l''-m'']|^{k-1} \cdot u[n''-l''-M_1] \quad (4)$$

where $Y''_{l'',m''}[n''-M_1]$ is an output signal of the ET amplifier 200, k is an order, l" is a relative delay that occurs with respect to an input signal u[n"] to the ET amplifier 200 in the signal amplification path, m" is a relative delay that occurs with respect to the input signal u[n"] of the ET amplifier 200 in the power supply path, $L_1$ is a maximum value of relative number of preceding samples in the signal amplification path, $M_1$ is a maximum value of relative number of preceding samples in the power supply path, $K_{l''-L1,m''-M1}$ is a maximum order of the characteristic of the ET amplifier 200, wherein the indices are a coefficient relating to the relative delay (signal amplification path) l"-$L_1$, and a coefficient relating to the relative delay (power supply path) m"-$M_1$, $H_{k,l''-L1,m''-M1}$ is a complex coefficient representing the characteristic of the ET amplifier 200, wherein the indices are a coefficient relating to the relative delay (signal amplification path) l"-$L_1$, a coefficient relating to the relative delay (power supply path) m"-$M_1$, and a coefficient relating to the order k.

V[n"-l"-m"] is a power supply voltage, and u[n"-l"-$M_1$] is an input signal after subjected to distortion compensation.

In the above equation (4), for example, when l"=0 and m"=0, the following equation 5 is satisfied.

[Equation 5]

$$Y''_{0,0}[n''-M_1] = \sum_{k=1}^{K_{-L_1,-M_1}} H_{k,-L_1,-M_1} \cdot |V[n'']|^{k-1} \cdot u[n''-M_1] \quad (5)$$

In equation (5), m"=0 represents the nonlinear characteristic of the ET amplifier 200 in a case where a memory effect (hereinafter referred to as "first memory effect") does not occur on the path from the signal input port 2a to the signal output port 2b (first path; signal amplification path), and l"=0 represents the nonlinear characteristic of the amplifier in a case where a memory effect (hereinafter referred to as "second memory effect") does not occur on the path from the power supply port (another input port) 2c to the signal output port 2b (second path; power supply path).

Accordingly, the model of the ET amplifier 200 obtained without taking into account both the first memory effect and the second memory effect is as shown in FIG. 3(a).

In the block diagram of FIG. 3(a), a delay element 12 is provided on the line of the input signal u[n"] to a nonlinear element 10 corresponding to the amplifier 2 constituting the ET amplifier 200, and a power supply voltage V[n"] according to the input signal u[n"] is supplied from a variable power supply 11 (corresponding to the variable power supply 3 shown in FIG. 1) to the nonlinear element 10. That is, an output $Y''_{0,0}[n''-M_1]$ from the nonlinear element 10 shown in FIG. 3(a) is defined by an input signal u[n"-$M_1$] that is an input to the signal input port 2a of the ET amplifier 200, and the power supply voltage V[n"] that is an input to the power supply port 2c of the amplifier 2 constituting the ET amplifier 200.

Further, as is apparent from FIG. 3(a) and equation (5), the input signal u[n"-$M_1$] and the power supply voltage V[n"], which are temporally different from each other, are reflected in the output. Although in FIG. 3(a) the delay element 12 is provided on the line of the input signal u[n"], even when a delay element is provided on the line on the variable power supply 11 side, equivalence is maintained. That is, in equation (5), if -$M_1$<0, the delay of u[n"] is greater, and if -$M_1$>0, the delay of V[n"] is greater.

In equation (5), if the first memory effect that occurs on the path from the signal input port 2a to the signal output port 2b is taken into account as in the conventional amplifier model, the model of the ET amplifier 200 is expressed by the following equation (6).

[Equation 6]

$$Y'_0[n'' - M_1] = \sum_{l''=0}^{L_1+L_2} Y''_{l'',0}[n'' - M_1] = \qquad (6)$$

$$\sum_{l''=0}^{L_1+L_2} \sum_{k=1}^{K_{l''-L_1,-M_1}} H_{k,l''-L_1,-M_1} \cdot |V[n'' - l'']|^{k-1} \cdot u[n'' - l'' - M_1]$$

where $Y'_0[n''-M_1]$ is an output signal of the ET amplifier 200, k is an order, l'' is a relative delay that occurs with respect to the input signal u[n''] of the ET amplifier 200 in the signal amplification path, $L_1$ is a maximum value of relative number of preceding samples in the signal amplification path, $L_2$ is a maximum value of relative number of delay samples in the signal amplification path, $M_1$ is a maximum value of relative number of preceding samples in the power supply path, $K_{l''-L1,-M1}$ is a maximum order of the characteristic of the ET amplifier 200, wherein the indices are a coefficient relating to the relative delay (signal amplification path) l''−$L_1$ and a coefficient relating to the relative delay (power supply path)−$M_1$, $H_{k,l''-L1,-M1}$ is a complex coefficient representing the characteristic of the ET amplifier 200, wherein the indices are a coefficient relating to the relative delay (signal amplification path) l''−$L_1$, a coefficient relating to the relative delay (power supply path) −$M_1$, and a coefficient relating to the order k, V[n''−l''] is a power supply voltage, and u[n''−l''−$M_1$] is an input signal after subjected to distortion compensation.

Further, the following equation (7) is derived by replacing n''−$L_1$ and l''−$L_1$ in equation (6) with n' and l', respectively.

[Equation 7]

$$Y'_0[n' - M_1] = \sum_{l'=-L_1}^{L_2} Y''_{l',0}[n' - M_1] = \qquad (7)$$

$$\sum_{l'=-L_1}^{L_2} \sum_{k=1}^{K_{l',-M_1}} H_{k,l',-M_1} \cdot |V[n' - l']|^{k-1} \cdot u[n' - l' - M_1]$$

The above equation (7) expresses nonlinear elements in which the first memory effect is represented, in the ET amplifier 200. That is, like FIG. 11 and equation (3), equation (7) expresses the ET amplifier 200 as a combination of $L_1+L_2+1$ nonlinear elements (one non-memory term for the first memory effect, and $L_1+L_2$ memory terms for the first memory effect). The plurality of ($L_1+L_2+1$) nonlinear elements may have different nonlinear characteristics, respectively.

In the present embodiment, the nonlinear elements in which the first memory effect is represented as shown in equation (7) are referred to as an "element amplifier". Like in FIG. 11, the plurality of ($L_1+L_2+1$) nonlinear elements constituting the element amplifier are each given the input signal inputted to the signal input port 2a, and a combination of outputs from the respective nonlinear elements corresponds to an output from the element amplifier.

Figure 11:
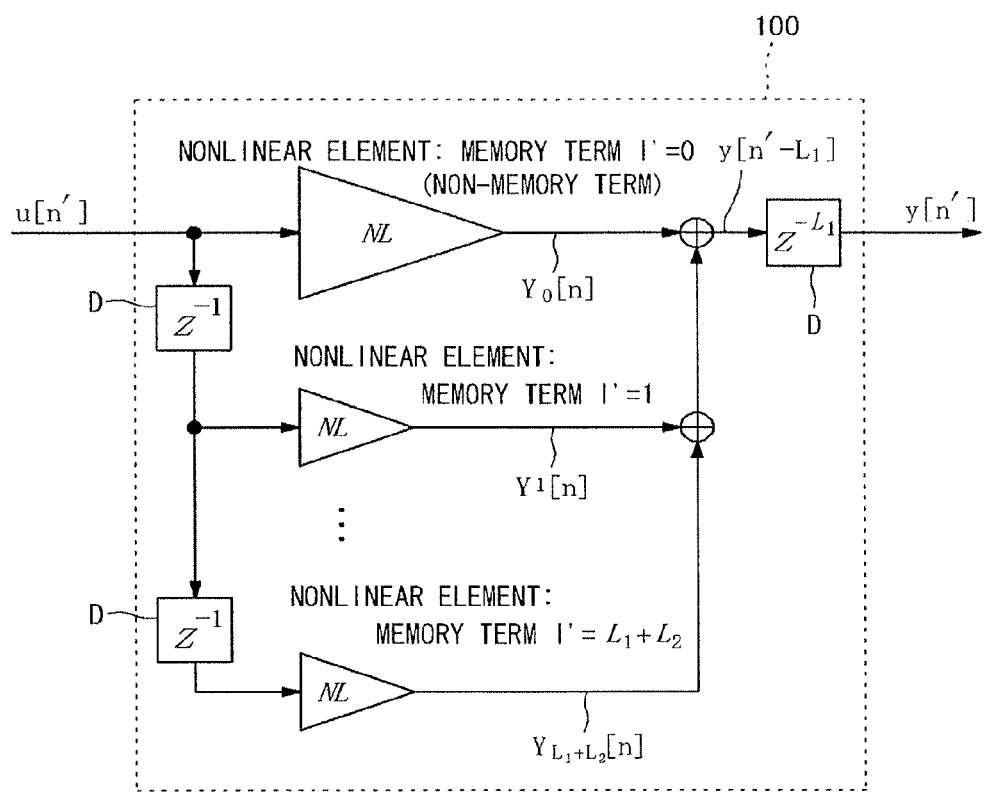
FIG. 11 is a block diagram showing the conventional amplifier model.

However, in the element amplifier, the nonlinear characteristics of the nonlinear elements are defined based on the input signal u and the power supply voltage V, in contrast to the nonlinear elements shown in FIG. 11 and equation (3). The plurality of nonlinear elements included in one element amplifier are given the input signals u[n'+$L_1$−$M_1$] . . . u[n'−$L_2$−$M_1$] at different times n'+$L_1$−$M_1$ . . . n'−$L_2$−$M_1$, respectively. In addition, the plurality of nonlinear elements included in one element amplifier are each given the power supply voltage V[n'−l'] at the common time n'−l'.

Next, using the model (element amplifier) expressed by equation (7), an ET amplifier model is defined, which takes into account the second memory effect that occurs on the path from the power supply port 2c to the signal output port 2b.

FIG. 3(b) shows a model of the ET amplifier 200 using the element amplifier 20 (an amplifier model taking into account the first and second memory effects).

In addition, the ET amplifier model shown in FIG. 3(b) is expressed by the following equations (8) and (9).

[Equation 8]

$$y[n' - M_1] = \sum_{m'=0}^{M_1+M_2} Y'_{m''}[n' - M_1] \qquad (8)$$

$$= \sum_{m'=0}^{M_1+M_2} \sum_{l'=L_1}^{L_2} \sum_{k=1}^{K_{l'',-M_1}} H_{k,l',m''-M_1} |V[n' - l' - m'']|^{k-1} \cdot$$

$$u[n' - M_1]$$

$$= \sum_{m'=0}^{M_1+M_2} \sum_{l'=L_1}^{L_2} \sum_{k=1}^{K_{l'',-M_1}} H_{k,l',m''-M_1} \qquad (9)$$

$$|V[(n' - M_1) - l' - (m'' - M_1)]|^{k-1} \cdot$$

$$u[(n' - M_1) - l']$$

where y[n'−$M_1$] is an output signal of the ET amplifier 200, k is an order, l' is a relative delay that occurs with respect to the input signal u[n'] of the ET amplifier 200 in the signal amplification path, m'' is a relative delay that occurs with respect to the input signal u[n'] of the ET amplifier 200 in the power supply path, $L_1$ is a maximum value of relative number of preceding samples in the signal amplification path, $L_2$ is a maximum value of relative number of delay samples in the signal amplification path, $M_1$ is a maximum value of relative number of preceding samples in the power supply path, $M_2$ is a maximum value of relative number of delay samples in the power supply path, $K_{l',-M1}$ is a maximum order of characteristic of the ET amplifier 200, wherein the indices are a coefficient relating to the relative delay (signal amplification path) l', and a coefficient relating to the relative delay (power supply path) −$M_1$, $H_{k,l',m''-M1}$ is a complex coefficient representing the characteristic of the ET amplifier 200, wherein the indices are a coefficient relating to the relative delay (signal amplification path) l', a coefficient relating to the relative delay (power supply path) m''−$M_1$, and a coefficient relating to the order k, V[n'−l'−m''], and V[(n−$M_1$)−l'−(m''−$M_1$)] are power supply voltages, and u[n'−l'−$M_1$], and u[(n'−$M_1$)−l'] are input signals after subjected to distortion compensation.

Figure 3:
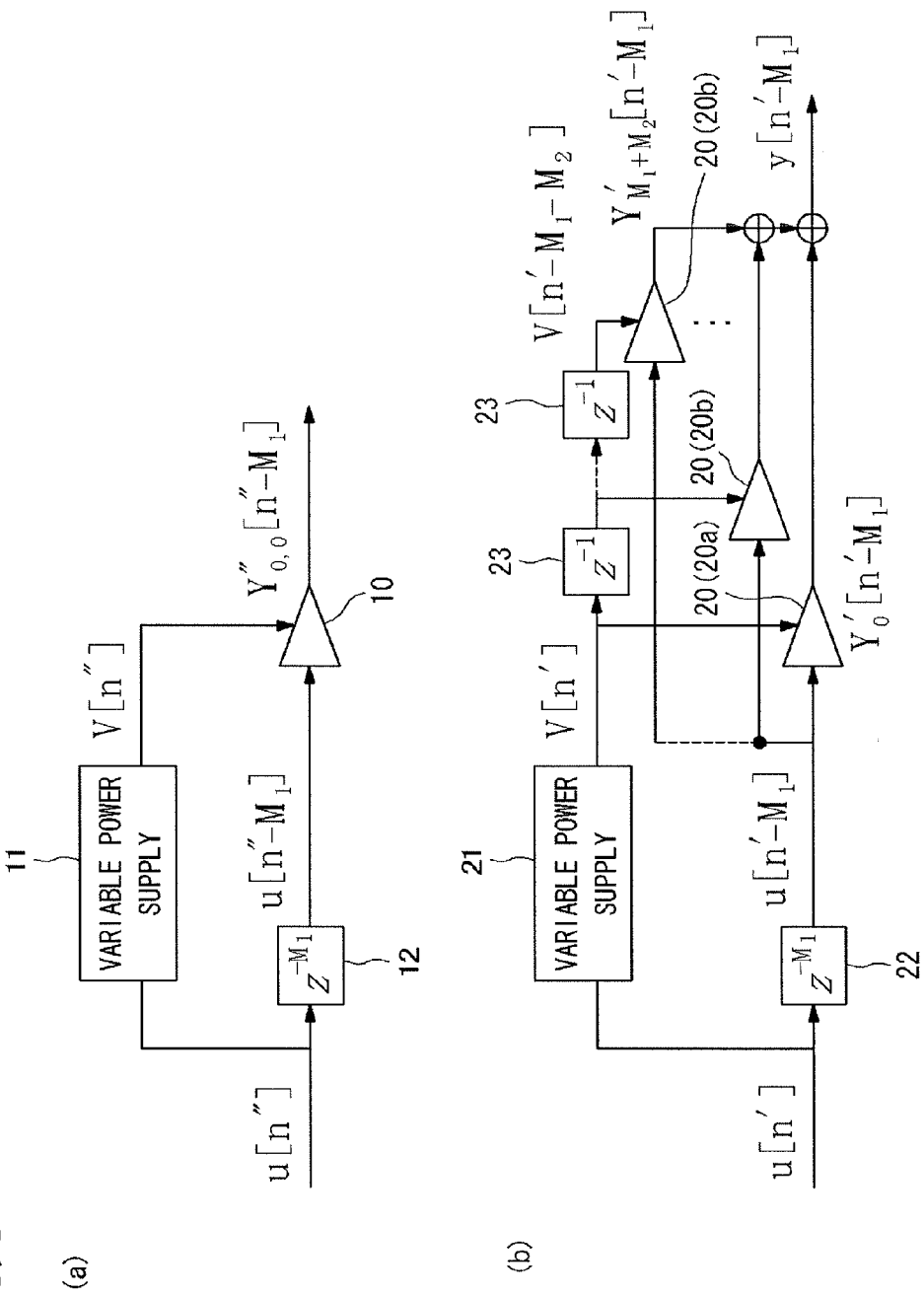
[FIG 3] (a) of FIG. 3 is a diagram that defines nonlinear characteristic of an ET amplifier without taking into account a memory effect, and (b) of FIG. 3 is a block diagram showing an amplifier model taking into account a second memory effect.

As shown in FIG. 3, the ET amplifier model is modeled as a combination of a plurality of element amplifiers 20. The ET amplifier model includes $M_1+M_2+1$ element amplifiers 20 (one element amplifier 20a as a non-memory term for the second memory effect, and $M_1+M_2$ element amplifiers 20b as memory terms for the second memory effect).

The plurality of element amplifiers 20 are each given the input signal $u[n'-M_1]$ at the common time $n'-M_1$ via the delay element 22 (corresponding to the delay element 12 shown in FIG. 3(a)). Although in FIG. 3(b) the delay element 22 is provided on the line of the input signal u[n'], a delay element may be provided on the line on the variable power supply 21 side, like in FIG. 3(a).

In addition, the plurality of element amplifiers 20 are each given the power supply voltage V supplied from the variable power supply 21 (corresponding to the variable power supply 3 shown in FIG. 1).

However, among the plurality of element amplifiers 20, the element amplifier 20a as a non-memory term for the second memory effect is given the power supply voltage V[n'] at time n', whereas the plurality of element amplifiers 20b as memory terms for the second memory effect are given the power supply voltages $V[n'-1] \ldots V[n'-M_1-M_2]$ at times $n'-1 \ldots n'-M_1-M_2$ delayed from time n', respectively. Therefore, delay elements 23 are provided in stages preceding the plurality of element amplifiers 20b as the memory terms, respectively, and the power supply voltages given to the respective element amplifiers 20 are temporally different from each other.

As described above, the input signal $u[n'-M_1]$ at time $n'-M_1$ is given to the respective element amplifiers 20, whereas the power supply voltage V (the input to the power supply port) given to the respective element amplifiers 20 varies from time n' to time $n'-M_1-M_2$.

That is, in the ET amplifier model shown in FIG. 3(b), the input signal $u[n'-M_1]$ at the certain time $n'-M_1$, and the power supply voltages $V[n'-1] \ldots V[n'-M_1-M_2]$ at the time $n'-M_1$ and times different from the time $n'-M_1$ are reflected in the output of the ET amplifier model.

However, actually, the input signals $u[n'+L_1-M_1] \ldots u[n'-L_2-M_1]$ at the plurality of $(L_1+L_2+1)$ times $n'+L_1-M_1 \ldots n'-L_2-M_1$ are reflected in the output of the element amplifier 20 in the ET amplifier model shown in FIG. 3(b) (refer to equation (7)).

Accordingly, in the actual output of the ET amplifier model, the input signals $u[n'+L_1-M_1] \ldots u[n'-L_2-M_1]$ at the plurality of $(L_1+L_2+1)$ times $n'+L_1-M_1 \ldots n'-L_2-M_1$ are reflected, and the power supply voltages at a plurality of $(M_1+M_2+1)$ times are taken into account for each of the times $n'+L_1-M_1 \ldots n'-L_2-M_1$ of the input signal u.

This point is more apparent from the following equation (10) that is obtained by subjecting the above equation (9) to the following replacement:

[Equation 9]

$$n = n' - M_1, m = m'' - M_1$$

[Equation 10]

$$y[n] \sum_{l'=-L_1}^{L_2} \sum_{m=-M_1}^{M_2} \sum_{k=1}^{K_{m,l}} H_{k,l,m} |V[n-l-m]|^{k-1} \cdot u[n-l] \quad (10)$$

where
y[n] is an output signal of the ET amplifier 200,
k is an order,
l is a relative delay that occurs with respect to the input signal u[n] of the ET amplifier 200 in the signal amplification path,
m is a relative delay that occurs with respect to the input signal u[n] of the ET amplifier 200 in the power supply path,
$L_1$ is a maximum value of relative number of preceding samples in the signal amplification path,
$L_2$ is a maximum value of relative number of delay samples in the signal amplification path,
$M_1$ is a maximum value of relative number of preceding samples in the power supply path,
$M_2$ is a maximum value of relative number of delay samples in the power supply path,
$K_{m,l}$ is a maximum order of characteristic of the ET amplifier 200, wherein the indices are a coefficient relating to the relative delay (signal amplification path) l, and a coefficient relating to the relative delay (power supply path) m,
$H_{k,l,m}$ is a complex coefficient representing the characteristic of the ET amplifier 200, wherein the indices are a coefficient relating to the relative delay (signal amplification path) l, a coefficient relating to the relative delay (power supply path) m, and a coefficient relating to the order k,
V[n-l-m] is a power supply voltage, and
u[n-l] is an input signal after subjected to distortion compensation.

That is, according to equation (10), the output of the ET amplifier model at time n is influenced by the input signal u and the power supply voltage V at times other than time n. The input signal u and the power supply voltage V each include those temporally different from each other.

More specifically, the input signals $u[n+L_1] \ldots u[n-L_2]$ at the plurality of $(L_1+L_2+1)$ times $n+L_1 \ldots n-L_2$, and the power supply voltages V[n-l-m] at the $(L_1+L_2+1) \times (M_1+M_2+1)$ times are reflected in the output of the ET amplifier model at time n. Note that $(L_1+L_2+1)$ indicates the number of taps in the delay model showing the first memory effect, and $(M_1+M_2+1)$ indicates the number of taps in the delay model showing the second memory effect.

[3. Application of ET Amplifier Model to Distortion Compensation Section]

Based on the ET amplifier model expressed by equation (10), an inverse model (inverse characteristic of the distortion characteristic of the ET amplifier 200) used in the distortion compensation processing section 8 shown in FIG. 1 is expressed by the following equation (11).

Inverse amplifier model (compensation section):

[Equation 11]

$$u[n] = \sum_{l=-L_1}^{L_2} \sum_{m=-M_1}^{M_2} \sum_{k=1}^{Kc_{m,l}} hinv_{k,l,m} \cdot |V[n-l-m]|^{k-1} \cdot x[n-l] \quad (11)$$

where
$hinv_{k,l,m}$ is a complex coefficient representing the inverse characteristic of the ET amplifier 200, wherein the indices are a coefficient relating to the relative delay (signal amplification path) l, a coefficient relating to the relative delay (power supply path) m, and a coefficient relating to the order k.

Generally, $Kc_{m,l} \geq K'_{m,l}$ is satisfied.

In the inverse characteristic estimation section 7, distortion compensation based on the inverse model that the inverse characteristic estimation section 7 currently possesses is performed for the output y[n] (the output having been subjected to gain attenuation corresponding to the ET amplifier gain) from the ET amplifier 2, and calculates an estimated value u'[n] of the input signal to the ET amplifier 2. Then, the inverse characteristic estimation section 7 calculates an error between the actual input signal u[n] and the estimated value u'[n], and optimizes the inverse model so as to minimize the error. Thus obtained inverse model is copied to the distortion compensation processing section 8, and used for distortion compensation by the distortion compensation processing section 8.

The input signal estimation value u'[n] calculated by the inverse characteristic estimation section 7 is expressed by the following equation (12), based on equation (11).

[Equation 12]

$$u'[n] = \sum_{l=-L_1}^{L_2} \sum_{m=-M_1}^{M_2} \sum_{k=1}^{Kc_{m,l}} hinv_{k,l,m} \cdot |V[n-l-m]|^{k-1} \cdot y[n-l] \quad (12)$$

According to equation (12), the inverse characteristic estimation section 7 can calculate the input signal estimation value u'[n], based on the power supply voltages V at the plurality of times, and the amplifier outputs y at the plurality of times. That is, the inverse characteristic estimation section 7 can estimate the inverse model, based on the power supply voltages V at the plurality of times, and the amplifier outputs y at the plurality of times.

[4. First Modification of ET Amplifier Model]

Figure 5:
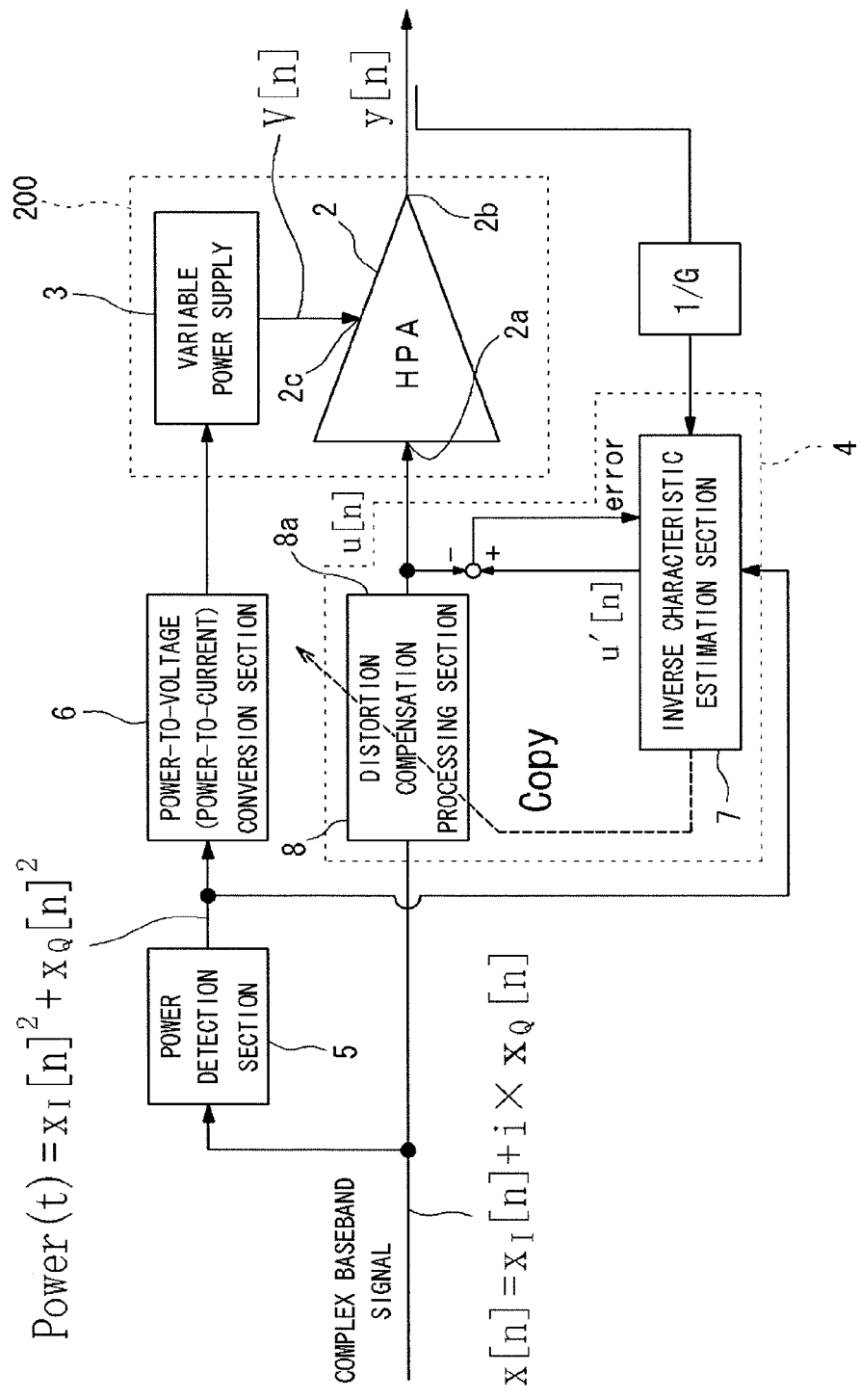
FIG. 5 is a block diagram showing an amplifier circuit using a first modification of the ET amplifier model.

FIG. 5 shows a configuration of an amplifier circuit 1 based on an ET amplifier model according to a first modification. In the amplifier circuit shown in FIG. 5, those points that are not particularly described are identical to those in the circuit shown in FIG. 1.

Figure 4:
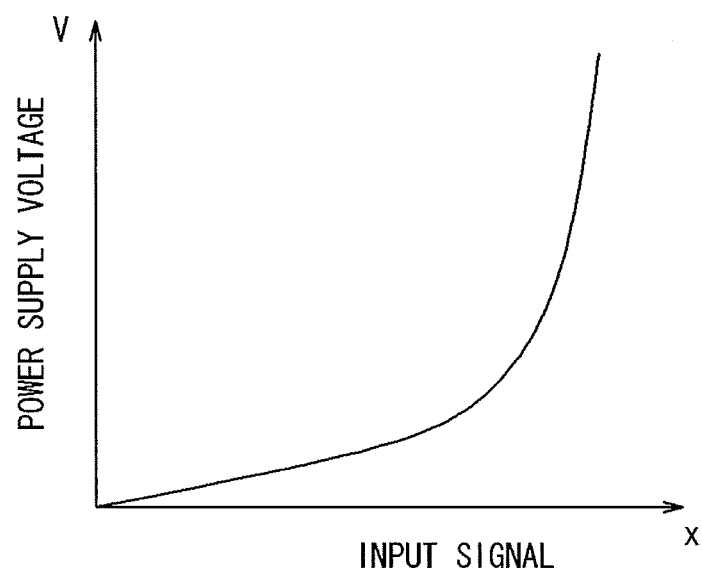
FIG. 4 is a characteristic diagram showing nonlinear conversion characteristics between an input signal and a power supply voltage.

The power-to-voltage conversion section 6 in the amplifier circuit 1 shown in FIG. 5 performs, as conversion from the power of the signal x[n] to the power supply voltage V[n], not linear conversion but nonlinear conversion as shown in FIG. 4. The nonlinear conversion shown in FIG. 4 is performed, in the range where input signal x[n] is small, to suppress an increase in the power supply voltage V[n] with an increase in the input signal x[n], whereas it is performed, in the range where the input signal x[n] is large, to promote an increase in the power supply voltage V[n] with an increase in the input signal x[n].

When the nonlinear conversion as shown in FIG. 4 is performed, the power supply voltage V[n] is expressed in a power series, as shown in the following equation (13).

[Equation 13]

$$|V[n-l-m]| = \sum_{s=1}^{K'_{m,l}} h'_{s,l,m} \cdot |x[n-l-m]|^{s-1} \quad (13)$$

where
s is an order,
$K'_{m,l}$ is a maximum order of s, and
$h'_{s,l,m}$ is a complex coefficient.

By developing and organizing equation (13) in accordance with equation (10), the following equation (14) is obtained.

[Equation 14]

$$\sum_{k=1}^{K_{m,l}} H_{k,l,m} |V[n-l-m]|^{k-1} = \sum_{k=1}^{K'_{m,l}} h_{k,l,m} \cdot |x[n-l-m]|^{k-1} \quad (14)$$

where
$h_{k,l,m}$ is a complex coefficient representing the characteristic of the ET amplifier 200, wherein the indices are a coefficient relating to the relative delay (signal amplification path) l, a coefficient relating to the relative delay (power supply path) m, and a coefficient relating to the order k.

Accordingly, the ET amplifier model expressed by equation (10) can be represented by using the pre-distortion-compensation input signal x[n] and the post-distortion-compensation input signal u[n], as shown in the following equation (15).

[Equation 15]

$$y[n] = \sum_{l=-L_1}^{L_2} \sum_{m=-M_1}^{M_2} \sum_{k=1}^{K'_{m,l}} h_{k,l,m} \cdot |x[n-l-m]|^{k-1} \cdot u[n-l] \quad (15)$$

where
$K'_{m,l}$ is a maximum order of the characteristic of the ET amplifier 200, wherein the indices are a coefficient relating to the relative delay (signal amplification path) l, and a coefficient relating to the relative delay (power supply path) m.

According to equation (15), the output of the ET amplifier model at time n is influenced by the post-distortion-compensation input signal u and the pre-distortion-compensation input signal x at times other than time n. The post-distortion-compensation input signal u and the pre-distortion-compensation input signal x each include those temporally different from each other.

More specifically, the post-distortion-compensation input signals u[n+$L_1$] . . . u[n−$L_2$] at a plurality of ($L_1$+$L_2$+1) times n+$L_1$ . . . t−$L_2$, and the pre-distortion-compensation input signals x[n−l−m] at ($L_1$+$L_2$+1)×($M_1$+$M_2$+1) times are reflected in the output of the ET amplifier model at time n.

Based on the ET amplifier model expressed by equation (15), an inverse model (inverse characteristic of the distortion characteristic of the ET amplifier 200) used in the distortion compensation processing section 8 shown in FIG. 5 is expressed by the following equation (16).

Inverse amplifier model (compensation section):

[Equation 16]

$$u[n] = \sum_{l=-L_1}^{L_2} \sum_{m=-M_1}^{M_2} \sum_{k=1}^{Kc_{m,l}} hinv_{k,l,m} \cdot |x[n-l-m]|^{k-1} \cdot x[n-l] \quad (16)$$

where
$Kc_{m,l}$ is a maximum order of the characteristic of the ET amplifier 200, wherein the indices are a coefficient relating to the relative delay (signal amplification path) l, and a coefficient relating to the relative delay (power supply path) m, and
$hinv_{k,l,m}$ is a complex coefficient representing the inverse characteristic of the ET amplifier 200, wherein the indices are a coefficient relating to the relative delay (signal amplification path) l, a coefficient relating to the relative delay (power supply path) m, and a coefficient relating to the order k.

In addition, an input signal estimation value u'[n] calculated by the inverse characteristic estimation section 7 shown in FIG. 5 is expressed by the following equation (17), based on equation (16).

[Equation 17]

$$u'[n] = \sum_{l=-L_1}^{L_2} \sum_{m=-M_1}^{M_2} \sum_{k=1}^{Kc_{m,l}} hinv_{k,l,m} \cdot |x[n-l-m]|^{k-1} \cdot y[n-l] \quad (17)$$

According to equation (17), the inverse characteristic estimation section 7 shown in FIG. 5 can calculate the input signal estimation value u'[n], based on the pre-distortion-compensation signals x at the plurality of times, and the amplifier outputs y at the plurality of times. That is, the inverse characteristic estimation section 7 can estimate the inverse model, based on the pre-distortion-compensation signals x at the plurality of times, and the amplifier outputs y at the plurality of times.

In the case of the amplifier circuit shown in FIG. 5, estimation of the amplifier model (inverse model) taking into account the second memory effect is possible without directly using the power supply voltage.

Further, in the case of the amplifier circuit 1 shown in FIG. 5, not only the nonlinear characteristic of the ET amplifier 200 but also the nonlinear characteristics of the driver amplifiers shown in FIG. 2 can be compensated by the distortion compensation section 4. That is, in the case of the amplifier circuit 1 shown in FIG. 5, not only the first and second memory effects of the ET amplifier 200 but also the nonlinear characteristics (first memory effects) of the other amplifiers (driver amplifiers 35a and 35b) provided between the signal output port 8a of the distortion compensation section 4 and the ET amplifier 200, can be compensated.

This is because the amplifier circuit 1 shown in FIG. 5 uses not V and y but x and y for the estimation of the inverse characteristic. When x and y are used for the estimation of the inverse characteristic, the estimated inverse characteristic is directed to all the amplifiers that are present between x and y.

Accordingly, the distortion compensation section 4 shown in FIG. 5 can compensate not only the second memory effect that occurs on the second path from the power supply port 2c to the signal output port 2b but also the first memory effects that occur in the amplifiers 2, 35a, and 35b provided on the first path from the signal output port 8a of the distortion compensation section 4 to the signal output port 2b of the amplifier.

[5. Second Modification of ET Amplifier Model]

Figure 6:
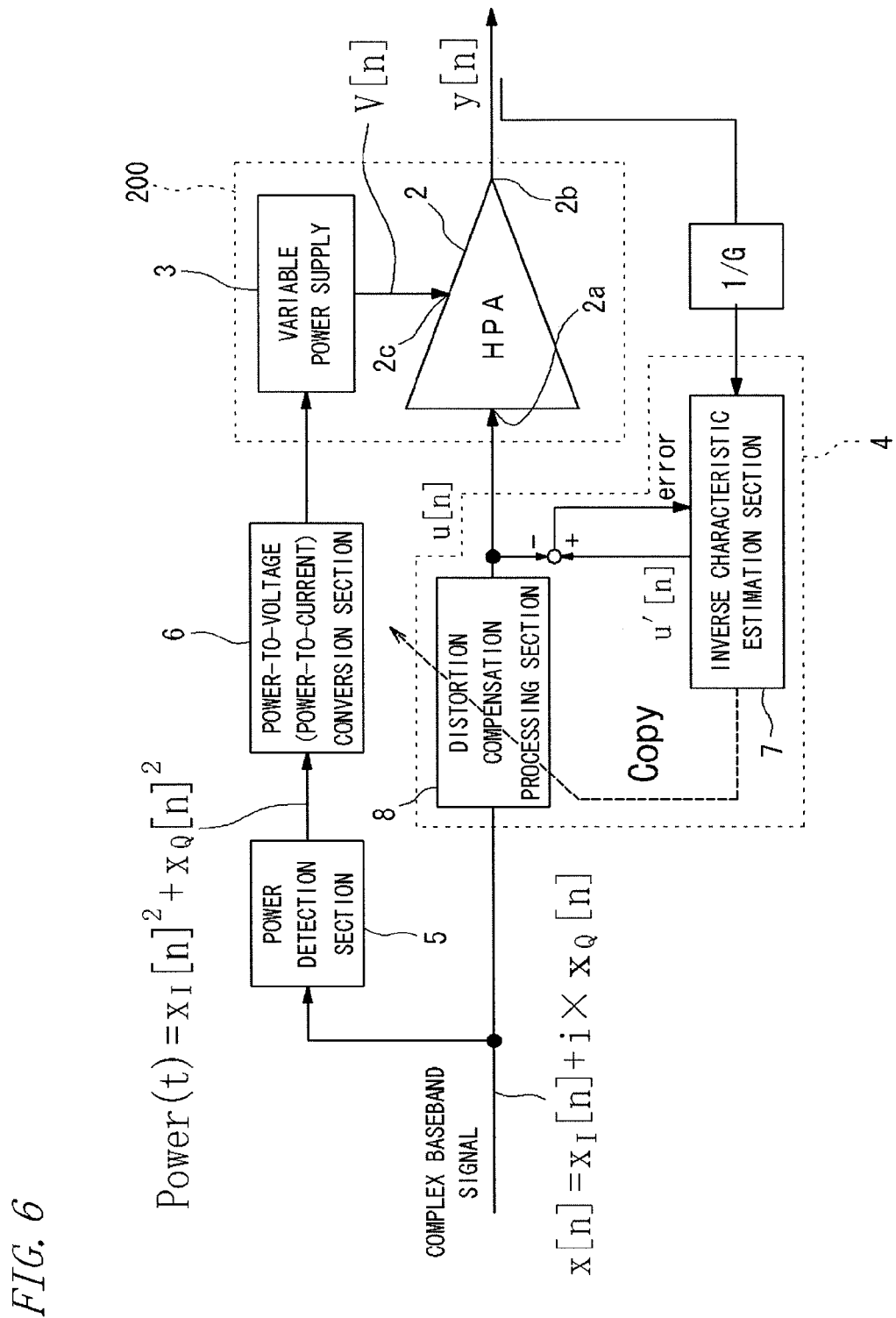
FIG. 6 is a block diagram showing an amplifier circuit using a second modification of the ET amplifier model.

FIG. 6 shows a configuration of an amplifier circuit 1 based on an ET amplifier model according to a second modification. In the amplifier circuit shown in FIG. 6, those points that are not particularly described are identical to those in the circuits shown in FIGS. 1 and 5.

In this modification, if the amplifier 2 is a linear amplifier having a relatively small distortion power, the amplifier output y[n] can be considered to be approximately equal to the input x[n] (y[n]≈x[n]).

Accordingly, equation (17) can be transformed to the following equation (18).

[Equation 18]

$$u'[n] = \sum_{l=-L_1}^{L_2} \sum_{m=-M_1}^{M_2} \sum_{k=1}^{Kc_{m,l}} hinv_{k,l,m} |y[n-l-m]|^{k-1} \cdot y[n-l] \quad (18)$$

Equation (18) is based on a premise that the output of the ET amplifier model (not the inverse model) at time n is influenced by the post-distortion-compensation input signal u and the amplifier output signal y (actually, the pre-distortion-compensation input signal x) at times other than time n. The post-distortion-compensation input signal u and the output signal y each include those temporally different from each other.

According to equation (18), the inverse characteristic estimation section 7 shown in FIG. 6 can calculate an input signal estimation value u'[n], based on the amplifier output y. That is, the inverse characteristic estimation section 7 can estimate an inverse model, based on the amplifier output y, without using the power supply voltage V or the pre-distortion-compensation signal x.

The amplifier 2 with the relatively small distortion preferably has an adjacent channel leakage ratio (ACLR) equal to or lower than −10 dBc (a distortion signal being equal to or smaller than 10% of a main signal).

Figure 7:
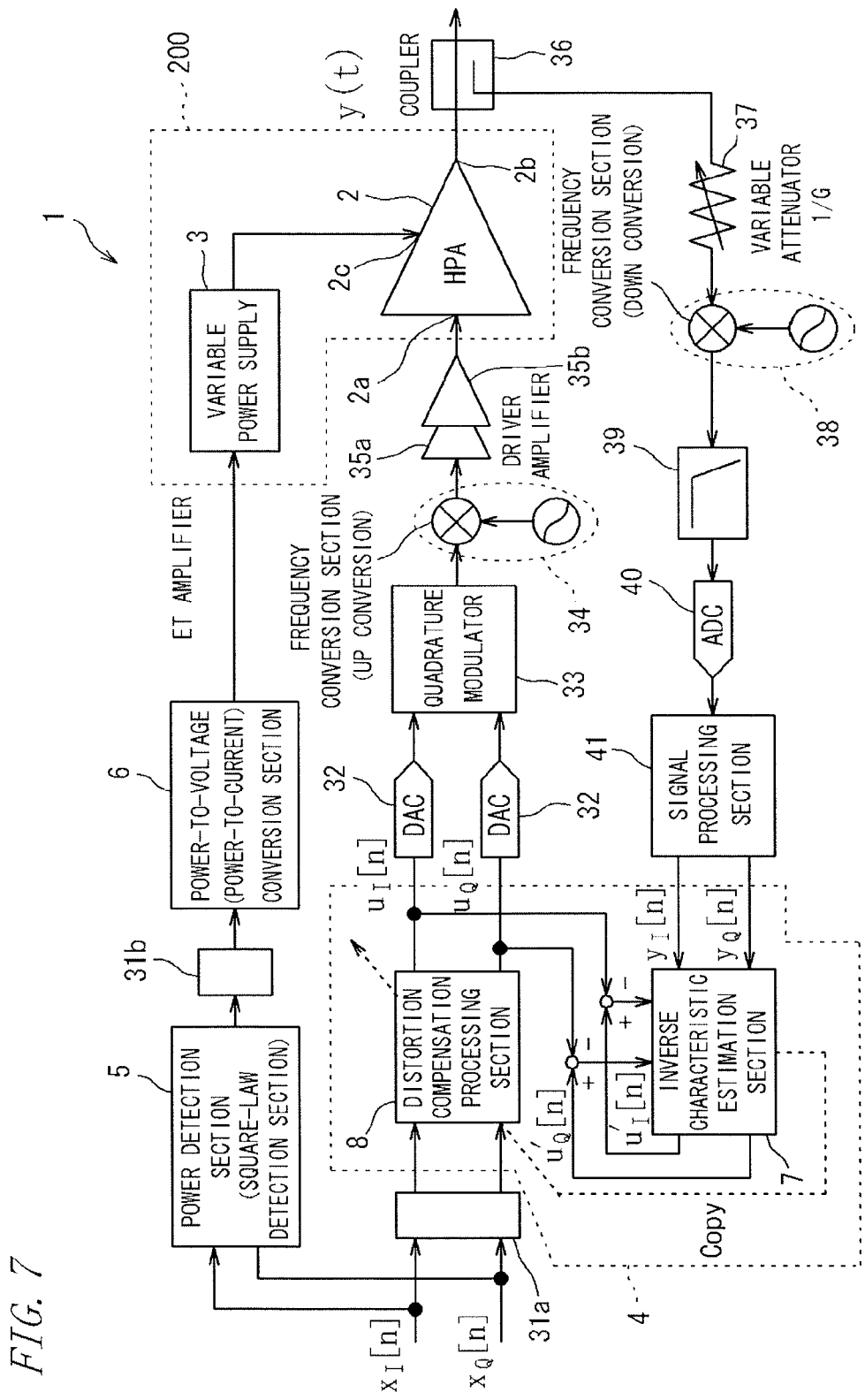
FIG. 7 is a specific circuit diagram showing the amplifier circuit shown in FIG. 6.

FIG. 7 shows a specific circuit configuration of the amplifier circuit 1 shown in FIG. 6. The circuit shown in FIG. 7 is almost identical to the circuit shown in FIG. 2 except that input of V[n] to the inverse characteristic estimation section 7 is not necessary in the circuit shown in FIG. 7.

Figure 8:
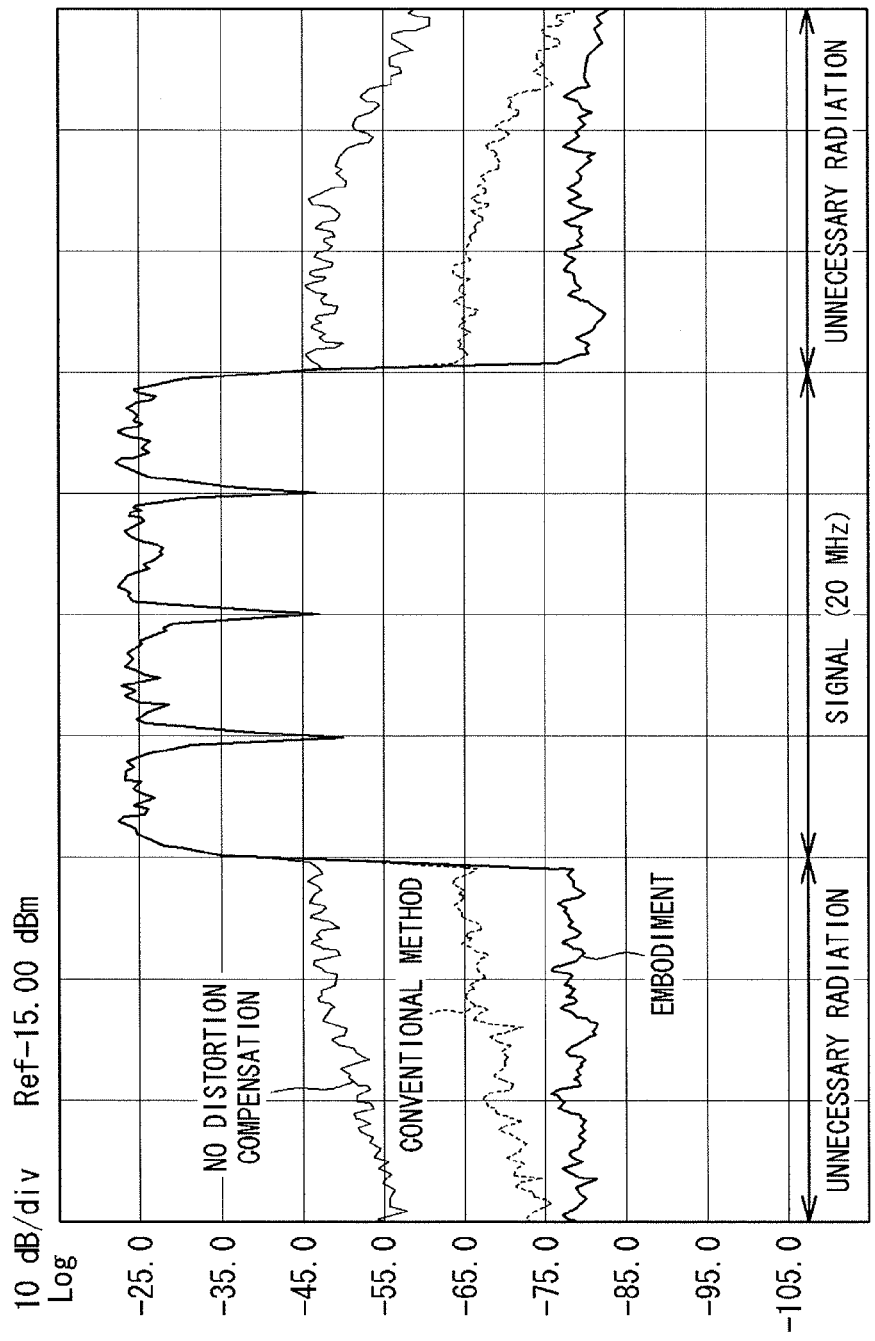
FIG. 8 shows a result of experiment showing unnecessary radiation in the amplifier shown in FIG. 6.

FIG. 8 shows a result of an experiment in which distortion compensation is performed using the inverse model estimated based on equation (18). As shown in FIG. 8, in the example using equation (18), unnecessary radiation outside the signal band is suppressed as compared with the case where distortion compensation is not performed, or with the conventional method using the conventional amplifier model. Thus, a satisfactory experimental result is obtained.

[6. Amplifier Model Taking into Account Only Second Memory Effect]

In the above embodiment, the ET amplifier model taking into account both the first memory effect and the second memory effect has been described. Hereinafter, an amplifier model taking into account only the second memory effect will be described.

It can be considered that the amplifier model taking into account only the second memory effect has no memory effect (no first memory effect) in the input-to-output path (the path from u[n'−M$_1$] to Y'$_{m''}$[n'−M$_1$]) of each of the plurality of element amplifiers 20 in FIG. 3(b).

That is, the ET amplifier model taking into account only the second memory effect is obtained by deleting the variable l' (l'=0) in equations (8) and (9), as shown by the following equation (19).

[Equation 19]

$$y[n' - M_1] = \sum_{m'=0}^{M_1+M_2} Y'_{m''}[n' - M_1] = \qquad (19)$$

$$\sum_{m''=0}^{M_1+M_2} \sum_{k=1}^{K_{0,-M_1}} H_{k,0,m''-M_1} |V[n'-m'']|^{k-1} \cdot u[n' - M_1] =$$

$$\sum_{m''=0}^{M_1+M_2} \sum_{k=1}^{K_{0,-M_1}} H_{k,0,m''-M_1}$$

$$|V[(n'-M_1)-(m''-M_1)]|^{k-1} \cdot u[(n'-M_1)]$$

Further, when a replacement similar to the replacement from equation (9) to equation (10) is performed on equation (19), the following equation (20) is obtained.

[Equation 20]

$$y[n] = \sum_{m=-M_1}^{M_2} \sum_{k=1}^{K_{m,l}} H_{k,l,m} |V[n-m]|^{k-1} \cdot u[n] \qquad (20)$$

When transformations similar to the transformations performed to derive, from equation (10), equations (11), (12), (15), (16), (17), and (18) are performed on equation (20), equations transformed from equation (20) are obtained.

[7. Application to Source Modulation]

Figure 9:
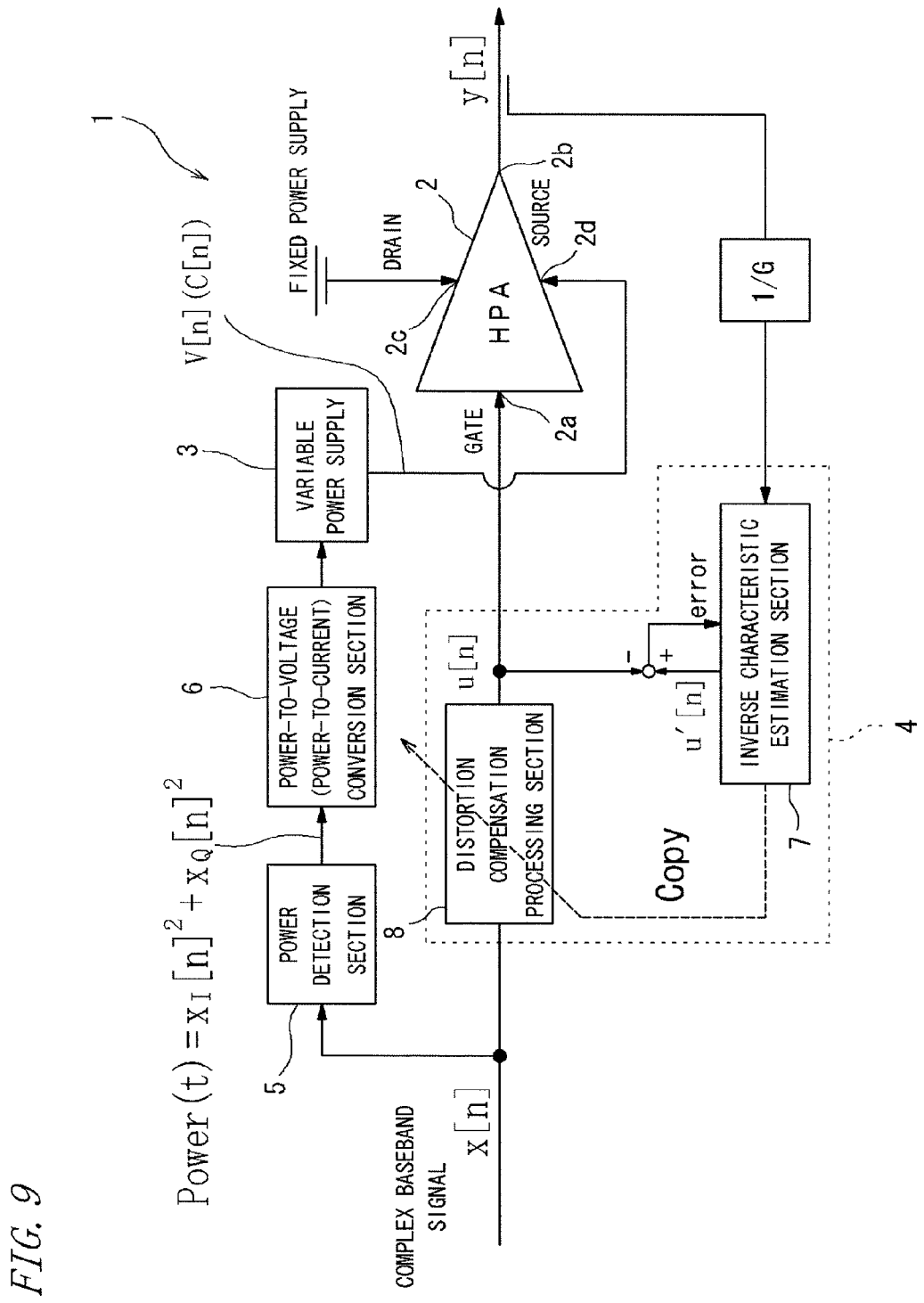
FIG. 9 is a block diagram showing a source modulation type amplifier circuit.
Figure 10:
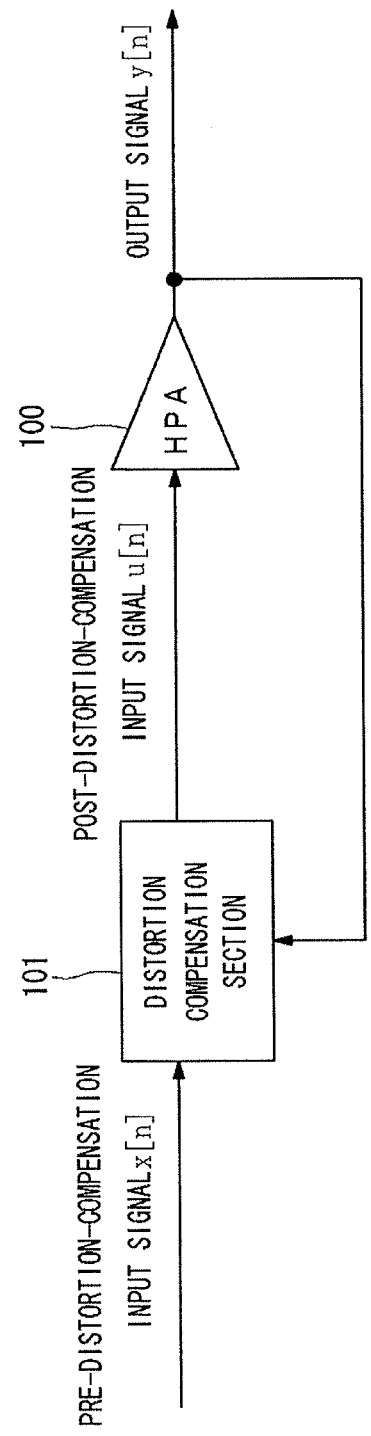
FIG. 10 is a block diagram showing the conventional amplifier circuit.

FIG. 9 shows an amplifier circuit 1 adopting a source modulation method. The amplifier circuit 1 shown in FIG. 9 is different from the amplifier circuit 1 shown in FIG. 1 in that the output of the variable power supply 3 is connected not to the power supply port (drain) 2c of the amplifier 2 but to the source-side port 2d of the amplifier 2. In addition, a fixed power supply for supplying a fixed voltage (or fixed current) is connected to the power supply port 2c of the amplifier 2.

In the source modulation type amplifier circuit 1 shown in FIG. 9, the source-side voltage (current) of the amplifier 2 is controlled in accordance with change in the envelope of the signal x.

In the source modulation type amplifier circuit 1, the source-side port 2d of the amplifier 2 serves as a signal input port, instead of the power supply port 2c.

That is, the source modulation type amplifier circuit 1 has, in addition to the first path from the signal input port 2a of the amplifier 2 to the signal output port 2b thereof, a second path from the source-side port 2d to the signal output port 2b. Also in the source modulation type amplifier circuit 1, a memory effect occurs in the second path as well as in the first path, and therefore, it is possible to compensate the first and second memory effects, as described with respect to FIGS. 1 to 6.

Since the source modulation type amplifier circuit 1 shown in FIG. 9 is different from the amplifier circuit 1 shown in FIG. 1 only in the port to which the variable power supply voltage V is supplied, an equation representing an amplifier model of the source modulation type amplifier circuit 1 is identical to that described above.

[8. Additional Notes]

The embodiment described above is to be considered in all respects as illustrative and not restrictive. The scope of the present invention is indicated by the appended claims rather than by the foregoing meaning, and all changes which come within the meaning and range of equivalency of the claims are therefore intended to be embraced therein.

For example, the amplifier circuit 1 is not limited to an envelope tracking type amplifier circuit, and may be an EER (Envelope Elimination and Restoration) type amplifier circuit.

In addition, the distortion compensation section 4 is not limited to one that estimates an inverse model of an amplifier, and performs distortion compensation by using the estimated inverse model. The distortion compensation section 4 may be one that estimates a forward model of an amplifier (distortion characteristic itself of the amplifier), obtains inverse characteristic of the amplifier from the estimated forward model, and performs distortion compensation using the inverse characteristic.

DESCRIPTION OF THE REFERENCE CHARACTERS

1 amplifier circuit
2 amplifier
2a signal input port
2b signal output port
2c power supply port
3 variable power supply
4 distortion compensation section
5 power detection section
6 power-to-voltage conversion section
7 estimation section
8 distortion compensation section
10 nonlinear element
20 element amplifier

The invention claimed is:

1. An amplifier circuit, comprising:
  an amplifier that amplifies a signal;
  a variable power supply that varies a power supply voltage or a power supply current to be supplied to a power supply port of the amplifier, in accordance with change in an envelope of the signal; and
  a distortion compensation section that performs compensation for distortion characteristics of the amplifier, wherein
  the distortion compensation section performs a process of compensating a memory effect that occurs on a path from the power supply port to a signal output port,
  the distortion compensation section includes an estimation section that estimates a model of the amplifier, and performs distortion compensation based on the model estimated by the estimation section,
  the model represents at least the memory effect that occurs on the path from the power supply port to the signal output port, and
  the process is performed on the signal to be inputted to a signal input port of the amplifier.

2. The amplifier circuit according to claim 1, wherein
  the distortion compensation section performs a process of compensating a second memory effect that occurs on a path from a signal input port of the amplifier to the signal output port.

3. The amplifier circuit according to claim 1, wherein
  in the model, the amplifier is modeled as a combination of a plurality of element amplifiers,
  the plurality of element amplifiers in the model are each given an input signal inputted to the signal input port, and the power supply voltage or the power supply current supplied from the variable power supply, a combination of outputs from the plurality of element amplifiers in the model corresponds to an output of the amplifier, the plurality of element amplifiers in the model each have nonlinear characteristic which is defined based on the input signal inputted to the signal input port, and the power supply voltage or the power supply current supplied from the variable power supply, and the plurality of element amplifiers in the model are given the power supply voltage or the power supply current at different times, respectively.

4. The amplifier circuit according to claim 3, wherein
the plurality of element amplifiers in the model are each modeled as a combination of a plurality of nonlinear elements, the plurality of nonlinear elements are each given the input signal inputted to the signal input port, a combination of outputs of the plurality of nonlinear elements corresponds to an output of the element amplifier, the plurality of nonlinear elements each have nonlinear characteristic which is defined based on the input signal and the power supply voltage or the power supply current, and the plurality of nonlinear elements are given the input signal at different times, respectively.

5. The amplifier circuit according to claim 1, wherein
the model is an amplifier model based on the following equation:

$$y[n] = \sum_{l=-L_1}^{L_2} \sum_{m=-M_1}^{M_2} \sum_{k=1}^{K_{m,l}} H_{k,l,m} |V[n-l-m]|^{k-1} \cdot u[n-l]$$

where
y[n] is an output of the amplifier at a time instance n, n being an integer,
k is an order,
l is a relative delay that occurs with respect to an input signal u[n] of the amplifier, in a path (hereinafter referred to as a "signal amplification path") from a signal input port of the amplifier to a signal output port,
m is a relative delay that occurs with respect to the input signal u[n] of the amplifier, in a path (hereinafter referred to as a "power supply path") from the power supply port of the amplifier to the signal output port,
$L_1$ is a maximum value of relative number of preceding samples in the signal amplification path,
$L_2$ is a maximum value of relative number of delay samples in the signal amplification path,
$M_1$ is a maximum value of relative number of preceding samples in the power supply path,
$M_2$ is a maximum value of relative number of delay samples in the power supply path,
$K_{m,l}$ is a maximum order of characteristic of the amplifier, wherein indices are a coefficient relating to the relative delay (signal amplification path) l, and a coefficient relating to the relative delay (power supply path) m,
$H_{k,l,m}$ is a complex coefficient representing the characteristic of the amplifier, wherein indices are a coefficient relating to the relative delay (signal amplification path) l, a coefficient relating to the relative delay (power supply path) m, and a coefficient relating to the order k,
V[n−l−m] is a power supply voltage, and
u[n−l] is an input signal after subjected to distortion compensation.

6. The amplifier circuit according to claim 1, wherein
the distortion compensation section also performs a process of compensating a third memory effect that occurs on a path from a signal output port of the distortion compensation section to the signal output port of the amplifier.

7. The amplifier circuit according to claim 1, wherein
the model is an amplifier model based on the following equation:

$$y[n] = \sum_{l=-L_1}^{L_2} \sum_{m=-M_1}^{M_2} \sum_{k=1}^{K_{m,l}} h_{k,l,m} \cdot |x[n-l-m]|^{k-1} \cdot u[n-l]$$

where
y[n] is an output of the amplifier at a time instance n, n being an integer,
k is an order,
l is a relative delay that occurs with respect to an input signal u[n] of the amplifier, in a path (hereinafter referred to as a "signal amplification path") from a signal input port of the amplifier to a signal output port,
m is a relative delay that occurs with respect to the input signal u[n] of the amplifier, in a path (hereinafter referred to as a "power supply path") from the power supply port of the amplifier to the signal output port,
$L_1$ is a maximum value of relative number of preceding samples in the signal amplification path,
$L_2$ is a maximum value of relative number of delay samples in the signal amplification path,
$M_1$ is a maximum value of relative number of preceding samples in the power supply path,
$M_2$ is a maximum value of relative number of delay samples in the power supply path,
$K'_{m,l}$ is a maximum order of characteristic of the amplifier, wherein indices are a coefficient relating to the relative delay (signal amplification path) l, and a coefficient relating to the relative delay (power supply path) m,
$h_{k,l,m}$ is a complex coefficient representing the characteristic of the amplifier, wherein indices are a coefficient relating to the relative delay (signal amplification path) l, a coefficient relating to the relative delay (power supply path) m, and a coefficient relating to the order k,
V[n−l−m] is a power supply voltage, and
u[n−l] is an input signal after subjected to distortion compensation.

8. The amplifier circuit according to claim 1, wherein
the distortion compensation section includes an estimation section that estimates an inverse model of the amplifier, and performs distortion compensation based on the inverse model estimated by the estimation section, and
the inverse model is an amplifier inverse model based on the following equation:

$$u'[n] = \sum_{l=-L_1}^{L_2} \sum_{m=-M_1}^{M_1} \sum_{k=1}^{Kc_{m,l}} hinv_{k,l,m} |y[n-l-m]|^{k-1} \cdot y[n-l]$$

where
u'[n] is an estimated value of an input signal u[n] of the amplifier, at a time instance n, n
k is an order,
l is a relative delay that occurs with respect to the input signal u[n] of the amplifier, in a path (hereinafter referred to as a "signal amplification path") from a signal input port of the amplifier to a signal output port, m is a relative delay that occurs with respect to the input signal u[n] of the amplifier, in a path (hereinafter referred to as a "power supply path") from the power supply port of the amplifier to the signal output port, $L_1$ is a maximum value of relative number of preceding samples in the signal amplification path, $L_2$ is a maximum value of relative number of delay samples in the signal amplification path, $M_1$ is a maximum value of relative number of preceding samples in the power supply path, $M_2$ is a maximum value of relative number of delay samples in the power supply path, $Kc_{m,l}$ is a maximum order of characteristic of the amplifier, wherein indices are a coefficient relating to the relative delay (signal amplification path) l, and a coefficient relating to the relative delay (power supply path) m, $hinv_{k,l,m}$ is a complex coefficient representing inverse characteristic of the amplifier, wherein indices are a coefficient relating to the relative delay (signal amplification path) l, a coefficient relating to the relative delay (power supply path) m, and a coefficient relating to the order k, and y[n−l−m], and y[n−l] are outputs of the amplifier.

9. Wireless communication equipment including the amplifier circuit according to claim 1, for amplification of a transmission signal or amplification of a reception signal.

10. An amplifier circuit, comprising:
an amplifier that amplifies a signal; and
a distortion compensation section that includes an estimation section that estimates a model of the amplifier, and that performs compensation for distortion characteristics of the amplifier based on the model estimated by the estimation section, wherein
the model represents a memory effect that occurs on a path from an input port other than a signal input port of the amplifier, to a signal output port such that distortion compensation section performs a process of compensating the memory effect that occurs on the path from the input port other than the signal input port of the amplifier, to the signal output port, and
the process is performed on the signal to be inputted to the signal input port of the amplifier.

11. Wireless communication equipment including the amplifier circuit according to claim 10, for amplification of a transmission signal or amplification of a reception signal.

12. An amplifier circuit, comprising:
an amplifier that amplifies a signal;
a variable power supply that varies a power supply voltage or a power supply current to be supplied to a power supply port of the amplifier, in accordance with change in an envelope of the signal; and
a distortion compensation section that includes an estimation section that estimates a model of the amplifier, and performs a process of distortion compensation based on the model estimated by the estimation section, wherein
in the model, the amplifier has nonlinear characteristic which is defined based on an input signal inputted to a signal input port of the amplifier, and the power supply voltage or the power supply current supplied from the variable power supply, the model represents at least a memory effect that occurs on a path from the power supply port to a signal output port of the amplifier, and
the process is performed on the signal to be inputted to a signal input port of the amplifier.

13. The amplifier circuit according to claim 12, wherein the model is an amplifier model based on the following equation:

$$Y''_{l'',m''}[n'' - M_1] = \sum_{k=1}^{K_{l''-L_1,m''-M_1}} H_{k,l''-L_1,m''-M_1} \cdot |V[n'' - l'' - m'']|^{k-1} \cdot u[n'' - l'' - M_1]$$

where $Y''_{l'',m''}[n''-M_1]$ is an output of the amplifier in the model at a time instance n, n being an integer, k is an order, l" is a relative delay that occurs with respect to an input signal u[n"] of the amplifier, in a path (hereinafter referred to as a "signal amplification path") from the signal input port of the amplifier to a signal output port, m" is a relative delay that occurs with respect to the input signal u[n"] of the amplifier, in a path (hereinafter referred to as a "power supply path") from the power supply port of the amplifier to the signal output port, $L_1$ is a maximum value of relative number of preceding samples in the signal amplification path, $M_1$ is a maximum value of relative number of preceding samples in the power supply path, $K_{l''-L1,m''-M1}$ is a maximum order of characteristic of the amplifier, wherein indices are a coefficient relating to the relative delay (signal amplification path) l"−$L_1$, and a coefficient relating to the relative delay (power supply path) m"−$M_1$, $H_{k,l''-L1,m''-M1}$ is a complex coefficient representing the characteristic of the amplifier, wherein indices are a coefficient relating to the relative delay (signal amplification path) l"−$L_1$, a coefficient relating to the relative delay (power supply path) m"−$M_1$, and a coefficient relating to the order k, V[n"−l"−m"] is a power supply voltage, and u[n"−l"−$M_1$] is an input signal after subjected to distortion compensation.

14. An amplifier circuit according to claim 12, wherein
in the model, the amplifier is modeled as a combination of a plurality of nonlinear elements,
the plurality of nonlinear elements are each given the input signal inputted to the signal input port,
a combination of outputs from the plurality of nonlinear elements corresponds to the output of the amplifier,
the plurality of nonlinear elements each have nonlinear characteristic which is defined based on the input signal and the power supply voltage or the power supply current, and
the plurality of nonlinear elements are given the input signal at different times, respectively.

15. The amplifier circuit according to claim 14, wherein the model is an amplifier model based on the following equation:

$$Y'_0[n' - M_1] = \sum_{l'=-L_1}^{L_2} Y''_{l',0}[n' - M_1] = \sum_{l'=-L_1}^{L_2} \sum_{k=1}^{K_{l',-M_1}} H_{k,l',-M_1} \cdot |V[n' - l']|^{k-1} \cdot u[n' - l' - M_1]$$

where $Y'_0[n'-M_1]$ is an output of the amplifier model at a time instance n, n being an integer, k is an order, l' is a relative delay that occurs with respect to an input signal u of the amplifier, in a path (hereinafter referred to as a "signal amplification path") from the signal input port of the amplifier to the signal output port, $L_1$ is a maximum value of relative number of preceding samples in the signal amplification path, $L_2$ is a maximum value of relative number of delay samples in the signal amplification path, $M_1$ is a maximum value of relative number of preceding samples, in a path (hereinafter referred to as "power supply path") from the power supply port of the amplifier to the signal output port, $K_{l''-L1,-M1}$ is a maximum order of characteristic of the amplifier, wherein indices are a coefficient relating to the relative delay (signal amplification path) $l''-L_1$, and a coefficient relating to the relative delay (power supply path) $-M_1$, $H_{k,l''-L1,-M1}$ is a complex coefficient representing the characteristic of the amplifier, wherein indices are a coefficient relating to the relative delay (signal amplification path) $l''-L_1$, a coefficient relating to the relative delay (power supply path) $-M_1$, and a coefficient relating to the order k, $V[n''-l'']$ is a power supply voltage, and $u[n''-l''-M_1]$ is an input signal after subjected to distortion compensation.

16. Wireless communication equipment including the amplifier circuit according to claim 12, for amplification of a transmission signal or amplification of a reception signal.

17. An amplifier circuit for amplifying a signal inputted thereto, comprising:

an amplifier; and a distortion compensation section that includes an estimation section that estimates a model of the amplifier, and that performs distortion compensation of the amplifier based on the model estimated by the estimation section, wherein the model represents memory effects that occur on a plurality of paths of the amplifier for amplifying the signal such that distortion compensation section performs a process of compensation of the memory effects in the plurality of paths for amplifying the signal, and the process is performed on the signal to be inputted to a signal input port of the amplifier.

18. The amplifier circuit according to claim 17, wherein the plurality of paths include a first path which is a signal amplification path of the amplifier, and a second path which is a path for a signal that varies in accordance with change in an envelope of the inputted signal.

19. Wireless communication equipment including the amplifier circuit according to claim 17, for amplification of a transmission signal or amplification of a reception signal.

* * * * *